(12) United States Patent
Horiba et al.

(10) Patent No.: US 7,749,618 B2
(45) Date of Patent: Jul. 6, 2010

(54) ORGANIC ELECTROLUMINESCENT DEVICE, PRODUCTION METHOD THEREOF, AND IMAGE DISPLAY MEDIUM

(75) Inventors: Koji Horiba, Kanagawa (JP); Hidekazu Hirose, Kanagawa (JP); Mieko Seki, Kanagawa (JP); Akira Imai, Kanagawa (JP); Tadayoshi Ozaki, Kanagawa (JP); Takeshi Agata, Kanagawa (JP); Katsuhiro Sato, Kanagawa (JP); Hirohito Yoneyama, Kanagawa (JP); Yohei Nishino, Kanagawa (JP); Kiyokazu Mashimo, Kanagawa (JP); Daisuke Okuda, Kanagawa (JP); Toru Ishii, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 564 days.

(21) Appl. No.: 11/801,078

(22) Filed: May 8, 2007

(65) Prior Publication Data
US 2008/0018240 A1    Jan. 24, 2008

(30) Foreign Application Priority Data
Jul. 21, 2006  (JP) .............................. 2006-199957

(51) Int. Cl.
*H05B 33/22*    (2006.01)
(52) U.S. Cl. .......................................... 428/690; 560/1
(58) Field of Classification Search .................. None
See application file for complete search history.

(56) References Cited

U.S. PATENT DOCUMENTS
6,936,679 B2 * 8/2005 Seki et al. ................... 528/125

FOREIGN PATENT DOCUMENTS
JP      59-194393        11/1984
JP      10-92576         4/1988
JP      2002-117982    *  4/2002

OTHER PUBLICATIONS
English translation of JP 2002-117982.*
Thin Solid Films, vol. 94, 171 (1982).
(Continued)

*Primary Examiner*—D. Lawrence Tarazano
*Assistant Examiner*—Gregory Clark
(74) *Attorney, Agent, or Firm*—Fildes & Outland, P.C.

(57) ABSTRACT

An organic electroluminescent device having a pair of electrodes including a positive electrode and a negative electrode at least one of which is transparent or translucent, and one or more organic compound layers interposed between the pair of electrodes, at least one layer of the organic compound layers containing at least one charge transporting polyester having a repeating unit that contains at least one structure selected from structures represented by the following formula (I-1) as a partial structure.

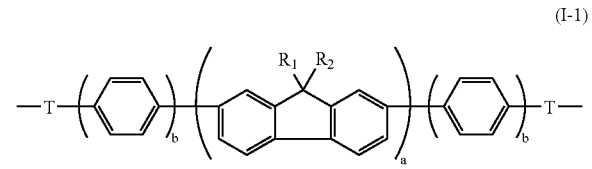

(I-1)

17 Claims, 1 Drawing Sheet

OTHER PUBLICATIONS

Applied Physics Letter, vol. 51, 913 (1987).
Technical Report of IEICE, OME95-54, 1995, pp. 47-52.
The 40th meeting, Japan Society of Applied Physics & Related Societies Preprints 30a-SZK-14, 1993.
Nature, vol. 357, 477 (1992).
Polymer Preprints, Japan, vol. 42, No. 7, 20J-21, 1993.
The 38th meeting, Japan Society of Applied Physics & Related Societies Preprints 31p-G-12 (1991).
The 50th meeting, Japan Society of Applied Physics, Preprints 29p-ZP-5 (1989).
The 51st meeting, Japan Society of Applied Physics, Preprints 28a-PB-7 (1990).

* cited by examiner

ORGANIC ELECTROLUMINESCENT DEVICE, PRODUCTION METHOD THEREOF, AND IMAGE DISPLAY MEDIUM

CROSS-REFERENCE TO RELATED APPLICATIONS

This application is based on and claims priority under 35 USC 119 from Japanese Patent Application No. 2006-199957 filed Jul. 21, 2006.

BACKGROUND

1. Technical Field

The present invention relates to an organic electroluminescent device that converts electric energy into light to emit and a production method thereof, and an image display medium. In more detail, the invention relates to an organic electroluminescent device that can be preferably used in the fields of display devices, electronic paper, back lights, illumination light sources, electrophotographic exposure devices, indicators, signboards and the like, a production method thereof and an image display medium.

2. Related Art

Light emission by these electroluminescent devices is a phenomenon in which electrons are injected from one electrode and holes are injected from another electrode, whereby, a light emitting material in an electroluminescent device is excited to a high energy level, and an excited light emitting substance releases, as light, extra energy produced when returned to a ground state. However, in these electroluminescent devices, a driving voltage is still as high as 30 V, densities of electron carriers and hole carriers present in a film are low, and a probability of production of photons by recombination of carriers is low. Therefore, sufficient luminance cannot be obtained, and these electroluminescent devices have not been put to practical use.

However, in 1987, Tang et al reported that in a function separated organic electroluminescent device obtained by sequentially layering a very thin film of a hole transporting organic low molecular weight compound and a very thin film of an electron transporting fluorescent organic low molecular weight compound on a transparent substrate by use of a vacuum vapor deposition method, at such a low voltage as substantially 10 V, such high brightness as 1000 cd/m² or more can be obtained. Since then, studies and developments of organic electroluminescent devices are being actively forwarded.

An electroluminescent device with the laminate structure has a structure in which an organic luminescent material and a charge transporting organic material (charge transport material) are layered on an electrode and holes and electrons of the respective organic materials move in the charge transport material and recombine to luminesce. As the organic luminescent materials, organic dyes that emit fluorescence such as 8-quinolinol aluminum complexes and cumarin compounds are used. Furthermore, as the charge transport materials, diamino compounds such as N,N-di(m-tolyl)N,N'-diphenyl benzidine and 1,1-bis[N,N-di(p-tolyl) aminophenyl]cyclohexane and 4-(N,N-diphenyl) aminobenzaldehyde-N,N-diphenyl hydrazone compounds can be included.

SUMMARY

According to an aspect of the invention, there is provided an organic electroluminescent device comprising: a pair of electrodes including a positive electrode and a negative electrode, at least one of which is transparent or translucent; and one or plual organic compound layers interposed between the pair of electrodes, at least one layer of the organic compound layers containing at least one charge transporting polyester having a repeating unit that contains at least one structure selected from structures represented by the following formula (I-1) as a partial structure:

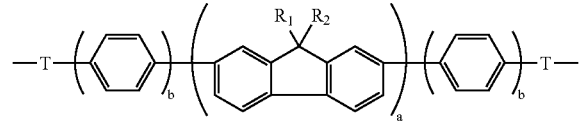

(I-1)

whererin in the formula (I-1), $R_1$ and $R_2$ each independently represent a mono-valent straight chain hydrocarbon group having 1 to 10 carbon atoms, a mono-valent branched chain hydrocarbon group having 3 to 10 carbon atoms, a substituted or unsubstituted mono-valent phenylene group, a substituted or unsubstituted mono-valent polynuclear aromatic hydrocarbon having 2 to 10 aromatic rings, a substituted or unsubstituted mono-valent condensed aromatic hydrocarbon having 2 to 10 aromatic rings, or a substituted or unsubstituted mono-valent aromatic heterocycle; T represents a divalent straight chain hydrocarbon group having 1 to 10 carbon atoms or a divalent branched chain hydrocarbon group having 2 to 10 carbon atoms; a represents an integer from 1 to 4; b represents an integer from 0 to 3.

DETAILED DESCRIPTION

Figure 1:
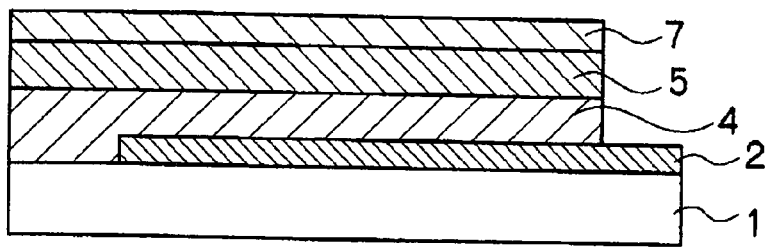
FIG. 1 is a schematic structure showing an example of a layer configuration of an organic electroluminescent device in an exemplary embodiment of the present invention.

After researching hard of charge transporting polymers, the inventors discovered that a particular charge transporting polyester has, in addition to the charge injection characteristics, charge mobility, thin film formability and luminescent characteristics, which are preferable as an organic electroluminescent device, the thermal stability during luminescence and the storage stability, and thereby the present invention came to completion.

Hereinafter, an organic electroluminescent device and a production method thereof according to an exemplary embodiment of the invention will be explained.

<Organic Electroluminescent Device and Production Method Thereof>

An organic electroluminescent device in an exemplary embodiment of the present invention (hereinafter, in some cases, referred to as "organic EL device") is constituted including: a pair of electrodes having a positive electrode and a negative electrode at least one of which is transparent or translucent; and one or plural organic compound layers interposed between the pair of electrodes, wherein at least one layer of the organic compound layers contains a charge transporting polyester having a repeating unit that contains at least onestructure selected from structures expressed by the following formula (I-1) as a partial structure.

In the beginning, the charge transporting polyester in the exemplary embodiment will be detailed.

(Charge Transporting Polyester)

The polyester has a repeating unit that contains at least one structure selected from structures expressed by the following formula (I-1) as a partial structure.

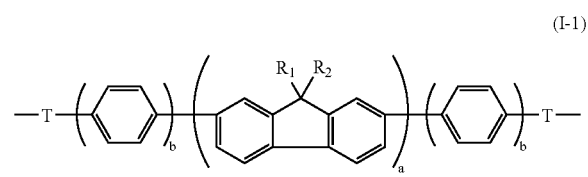

(In the formula (I-1), $R_1$ and $R_2$ each independently represent a mono-valent straight chain hydrocarbon group having 1 to 10 carbon atoms, a mono-valent branched chain hydrocarbon group having 3 to 10 carbon atoms, a substituted or unsubstituted mono-valent phenylene group, a substituted or unsubstituted mono-valent polynuclear aromatic hydrocarbon having 2 to 10 aromatic rings, a substituted or unsubstituted mono-valent condensed aromatic hydrocarbon having 2 to 10 aromatic rings, or a substituted or unsubstituted mono-valent aromatic heterocycle; T represents a divalent straight chain hydrocarbon group having 1 to 10 carbon atoms or a divalent branched chain hydrocarbon group having 2 to 10 carbon atoms; and a represents an integer from 1 to 4; and b represents an integer from 0 to 3.)

In the formula (I-1), the numbers of carbon atoms that constitute straight chain hydrocarbon groups selected as structures representing $R_1$ and $R_2$ are from 1 to 10, preferably from 2 to 8 and more preferably from 2 to 4.

In the formula (I-1), the numbers of carbon atoms that constitute branched chain hydrocarbon groups selected as structures expressing $R_1$ and $R_2$ are from 3 to 10, preferably from 3 to 7 and more preferably from 3 to 5.

In the formula (I-1), the numbers of aromatic rings that constitute the polynuclear aromatic hydrocarbons and the condensed aromatic hydrocarbons selected as structures that represent $R_1$ and $R_2$ are from 2 to 10. However, in the condensed aromatic hydrocarbons, the number from 1 to 5 is preferred.

The polynuclear aromatic hydrocarbon, condensed aromatic hydrocarbon and aromatic heterocycle specifically mean in exemplary embodiment polycyclic aromatic groups defined below.

That is, the "polynuclear aromatic hydrocarbon" represents a hydrocarbon in which two or more aromatic rings constituted of carbon atoms and hydrogen atoms are present and the rings are bonded each other through a carbon-carbon bond. Specifically, biphenyl and terphenyl can be included.

The "condensed aromatic hydrocarbon" represents a hydrocarbon compound in which two or more aromatic rings constituted of carbon atoms and hydrogen atoms are present and the aromatic rings share a pair of adjacently bonded carbon atoms. Specifically, naphthalene, anthracene, pyrene, phenanthrene, perylene and fluorene can be included.

The "aromatic heterocycle" represents an aromatic ring that contains other devices than carbon and hydrogen. Both of one in which an aromatic ring is substituted with a heterocycle and one where a heterocycle is substituted with an aromatic ring are included. As the heterocycle, ones in which the number of atoms (Nr) that constitute a ring skeleton thereof is 5 and/or 6 are preferably used. Furthermore, the kinds and numbers of atoms (foreign atoms) other than carbon atoms that constitute a ring skeleton are not particularly restricted. However, sulfur atom, nitrogen atom and oxygen atom are preferably used. In the ring skeleton, two or more kinds and/or two or more of foreign atoms may be contained. In particular, as heterocycles having a 5-membered ring structure, thiophene, pyrrole and furan or heterocycles obtained by substituting carbon atoms at 3 and 4 positions of the compound with a nitrogen atom can be preferably used. As heterocycles having a 6-membered ring structure, pyridine can be preferably used. As the aromatic ring, in addition to a phenyl group, polynucleus aromatic hydrocarbons and condensed aromatic hydrocarbons can be included.

These may be one all of which is constituted of a conjugate system or one part of which is constituted of a conjugate system. However, from the viewpoints of the charge transportability and luminescent efficiency, one all of which is constituted of a conjugate system is preferred.

In the formula (I-1), as substitution groups capable of substituting the respective groups selected as structures representing $R_1$ and $R_2$, a hydrogen atom, alkyl group, alkoxy group, aryl group, aralkyl group, substituted amino group and halogen atom can be included. As the alkyl group, ones having 1 to 10 carbon atoms such as a methyl group, ethyl group, propyl group and isopropyl group can be preferably included. As the alkoxy group, ones having 1 to 10 carbon atoms such as a methoxy group, ethoxy group, propoxy group and isopropoxy group are preferably included. As the aryl group, ones having 6 to 20 carbon atoms such as a phenyl group and toluyl group can be included. As the aralkyl group, ones having 7 to 20 carbon atoms such as benzyl group and phenetyl group can be preferably included. As the substitution groups of substituted amino group, an alkyl group, aryl group and aralkyl group can be preferably included. Specific examples are as mentioned above.

Among these, in order to heighten the ionization potential, $R_1$ and $R_2$ are preferred to be a phenyl group or a toluyl group. Furthermore, in order to lower the ionization potential, $R_1$ and $R_2$ are preferred to be a substituted amino group such as a triphenyl amino group. Still furthermore, in order to improve the solubility in and the compatibility with solvents and resins, $R_1$ and $R_2$ are preferred to be an alkyl group such as a methyl group, hexyl group and octyl group, the hexyl group being more preferred.

In the formula (I-1), a represents an integer from 1 to 4. However, from the viewpoint of the solubility in and compatibility with solvents and resins, an integer from 1 to 2 is preferred. Although b represents an integer from 0 to 3, from the viewpoint of improving the glass transition temperature and realizing higher thermal stability, an integer from 1 to 3 is preferred. In particular, in order to realize, with a good balance, improvements of the respective characteristics of the charge injectability, charge mobility, thin film formability, luminescence characteristics, thermal stability during luminescence and storage stability, a=1 and b=2 are preferred.

In the formula (I-1), T represents a divalent straight chain hydrocarbon group having 1 to 6 carbon atoms or a divalent branched chain hydrocarbon group having 2 to 10 carbon atoms and is preferably selected from divalent straight chain hydrocarbon groups having 2 to 6 carbon atoms and divalent branched chain hydrocarbon groups having 3 to 7 carbon atoms. Among these, more specifically, divalent hydrocarbon groups shown below are particularly preferred.

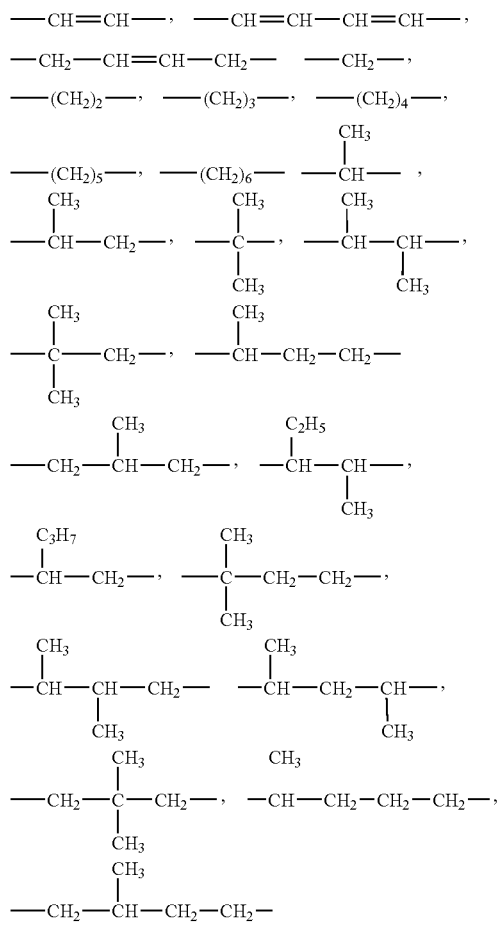

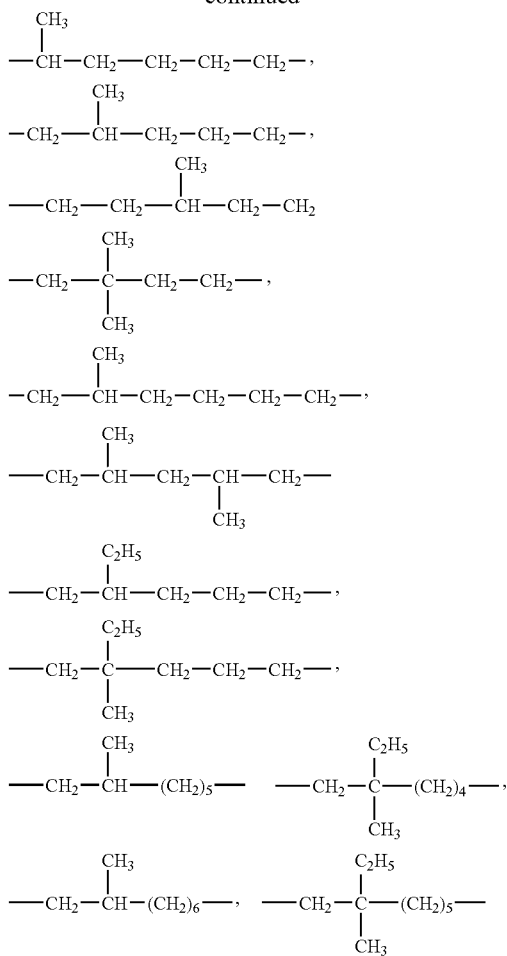

Here, specific examples of structures shown by the formula (I-1) are shown below. However, the specific examples are not restricted thereto.

TABLE 1

| Structure | Ar | a | b | T |
|---|---|---|---|---|
| 1 | 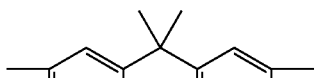 | 1 | 0 | —CH$_2$CH$_2$— |
| 2 | 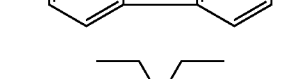 | 1 | 0 | —CH$_2$CH$_2$— |
| 3 | 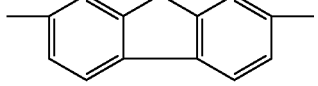 | 1 | 0 | —CH$_2$CH$_2$— |

TABLE 1-continued
| Structure | Ar | a | b | T |
|---|---|---|---|---|
| 4 | 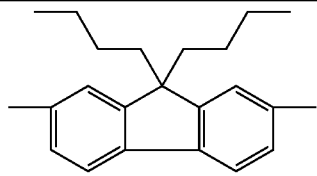 | 1 | 0 | 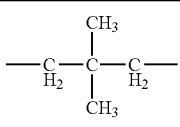 |
| 5 | 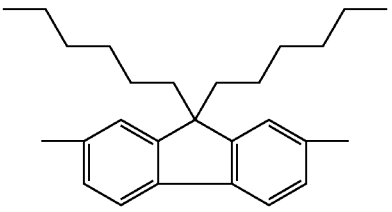 | 1 | 0 | 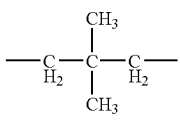 |
| 6 | 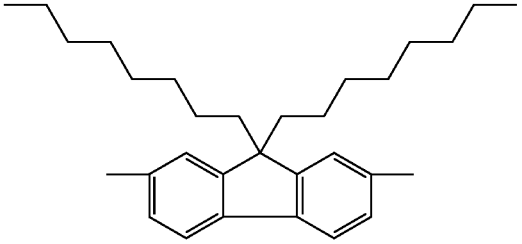 | 1 | 0 | —CH$_2$CH$_2$— |
| 7 | 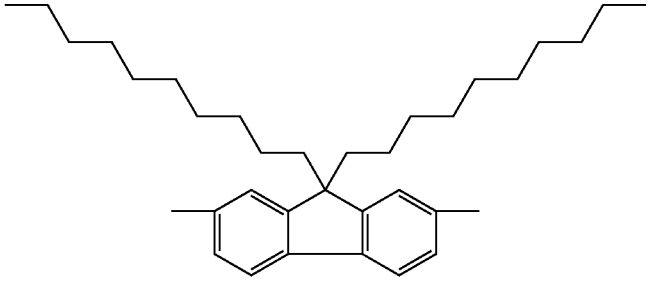 | 1 | 0 | —CH$_2$CH$_2$— |
| 8 | 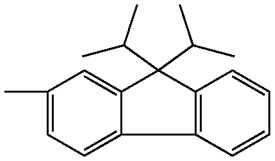 | 1 | 0 | —CH$_2$CH$_2$— |
| 9 | 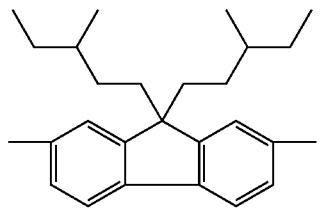 | 1 | 0 | —CH$_2$CH$_2$— |

TABLE 1-continued

| Structure | Ar | a | b | T |
|---|---|---|---|---|
| 10 | (9,9-bis(2-ethylhexyl)-2-methylfluorenyl group) | 1 | 0 | —CH₂CH₂— |

TABLE 2

| Structure | Ar | a | b | T |
|---|---|---|---|---|
| 11 | 9,9-diphenyl-2-methylfluorenyl | 1 | 0 | —CH₂— |
| 12 | 9,9-bis(4'-tert-butylbiphenyl-4-yl)-2-methylfluorenyl | 1 | 0 | —CH₂CH₂— |
| 13 | 9,9-di(2-naphthyl)-2-methylfluorenyl | 1 | 0 | —CH₂— |
| 14 | 2-methyl-9,9'-spirobifluorenyl | 1 | 0 | —CH₂CH₂— |
| 15 | 9,9-bis(5-methyl-2-thienylsilyl)-2-methylfluorenyl | 1 | 0 | $-\underset{H_2}{C}-\underset{\underset{CH_3}{\overset{CH_3}{|}}}{C}-\underset{H_2}{C}-$ |

TABLE 2-continued

| Structure | Ar | a | b | T |
|---|---|---|---|---|
| 16 | 9,9-dimethylfluorene-2,7-diyl | 1 | 1 | —CH$_2$CH$_2$— |
| 17 | 9,9-dipropylfluorene-2,7-diyl | 1 | 1 | —CH$_2$CH$_2$— |
| 18 | 9,9-dipropylfluorene-2,7-diyl | 1 | 1 | —CH$_2$CH$_2$— |
| 19 | 9,9-dibutylfluorene-2,7-diyl | 1 | 1 | —CH$_2$CH$_2$— |
| 20 | 9,9-dihexylfluorene-2,7-diyl | 1 | 1 | —CH$_2$CH$_2$— |

TABLE 3

| Structure | Ar | a | b | T |
|---|---|---|---|---|
| 21 | 9,9-dioctylfluorene-2,7-diyl | 1 | 1 | —CH$_2$CH$_2$— |
| 22 | 9,9-didodecylfluorene-2,7-diyl | 1 | 1 | —CH$_2$CH$_2$— |

TABLE 3-continued

| Structure | Ar | a | b | T |
|---|---|---|---|---|
| 23 | (9,9-diisopropyl-2-fluorenyl) | 1 | 1 | —CH₂—C(CH₃)(CH₃)—CH₂— |
| 24 | (9,9-bis(2-methylbutyl)-fluorene-2,7-diyl) | 1 | 1 | —CH₂CH₂— |
| 25 | (9,9-bis(2-ethylhexyl)-fluorene-2,7-diyl) | 1 | 1 | —CH₂CH₂— |
| 26 | (9,9-diphenyl-fluorene-2,7-diyl) | 1 | 1 | —CH₂— |
| 27 | (9,9-bis(4-tert-butylphenyl)-fluorene-2,7-diyl) | 1 | 1 | —CH₂CH₂— |
| 28 | (9,9-bis(4'-tert-butylbiphenyl-4-yl)-fluorene-2,7-diyl) | 1 | 1 | —CH₂CH₂— |

TABLE 3-continued

| Structure | Ar | a | b | T |
|---|---|---|---|---|
| 29 | (9,9-di(naphthalen-2-yl)fluorene-2,7-diyl) | 1 | 1 | —CH₂CH₂— |
| 30 | (9,9-di(pyren-1-yl)fluorene-2,7-diyl) | 1 | 1 | —CH₂CH₂— |

TABLE 4

| Structure | Ar | a | b | T |
|---|---|---|---|---|
| 31 | (9,9'-spirobifluorene-2,7-diyl) | 1 | 1 | —CH₂CH₂— |
| 32 | (9,9-bis(5-methylthiophen-2-yl)fluorene-2,7-diyl) | 1 | 1 | —CH₂CH₂— |
| 33 | (9,9-bis(5-methylsilol-2-yl)fluorene-2,7-diyl) | 1 | 1 | —CH₂CH₂— |
| 34 | (9,9-bis(5-methylthiazol-2-yl)fluorene-2,7-diyl) | 1 | 1 | —CH₂CH₂— |

TABLE 4-continued

| Structure | Ar | a | b | T |
|---|---|---|---|---|
| 35 | (structure) | 1 | 1 | —CH$_2$CH$_2$— |
| 36 | (structure) | 1 | 2 | —CH$_2$CH$_2$— |
| 37 | (structure) | 1 | 2 | —CH$_2$CH$_2$— |
| 38 | (structure) | 1 | 2 | —CH$_2$CH$_2$— |
| 39 | (structure) | 1 | 2 | —CH$_2$CH$_2$— |
| 40 | (structure) | 1 | 2 | —CH$_2$CH$_2$— |

TABLE 5

| Structure | Ar | a | b | T |
|---|---|---|---|---|
| 41 | (2,7-disubstituted 9,9-bis(2-methylbutyl)fluorene) | 1 | 2 | —CH₂CH₂— |
| 42 | (2,7-disubstituted 9,9-bis(2,5-dimethylhexyl)fluorene) | 1 | 2 | —CH₂CH₂— |
| 43 | (2,7-disubstituted 9,9-bis(4-tert-butylphenyl)fluorene) | 1 | 2 | —CH₂CH₂— |
| 44 | (2,7-disubstituted 9,9-bis(5-methylthien-2-yl)fluorene) | 1 | 2 | —CH₂—C(CH₃)₂—CH₂— |
| 45 | (2,7-disubstituted 9,9-bis(5-methylsilol-2-yl)fluorene) | 1 | 2 | —CH₂—C(CH₃)₂—CH₂— |
| 46 | (2,7-disubstituted 9,9-dihexylfluorene) | 1 | 3 | —CH₂CH₂— |

TABLE 5-continued

| Structure | Ar | a | b | T |
|---|---|---|---|---|
| 47 | (9,9-dioctylfluorene-2,7-diyl) | 1 | 3 | —CH$_2$CH$_2$— |
| 48 | (9,9-diisopropylfluorene-2,7-diyl) | 1 | 3 | —CH$_2$CH$_2$— |
| 49 | (9,9-bis(4-methylpentyl)fluorene-2,7-diyl) | 1 | 3 | —CH$_2$CH$_2$— |
| 50 | (9,9-bis(4-tert-butylphenyl)fluorene-2,7-diyl) | 1 | 3 | —CH$_2$CH$_2$— |

TABLE 6

| Structure | Ar | a | b | T |
|---|---|---|---|---|
| 51 | (9,9-dimethylfluorene-2,7-diyl) | 2 | 0 | —CH$_2$CH$_2$— |
| 52 | (9,9-diethylfluorene-2,7-diyl) | 2 | 0 | —CH$_2$— |
| 53 | (9,9-dipropylfluorene-2,7-diyl) | 2 | 0 | —CH$_2$CH$_2$— |

TABLE 6-continued
| Structure | Ar | a | b | T |
|---|---|---|---|---|
| 54 | 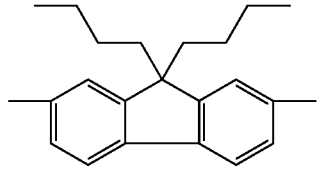 | 2 | 0 | —(CH$_2$)$_4$— |
| 55 | 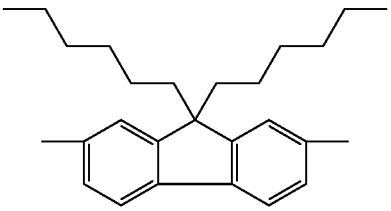 | 2 | 0 | $-\underset{H_2}{C}-\underset{\underset{CH_3}{\overset{CH_3}{|}}}{C}-\underset{H_2}{C}-$ |
| 56 | 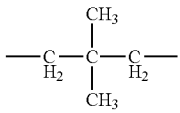 | 2 | 0 | —CH$_2$CH$_2$— |
| 57 | 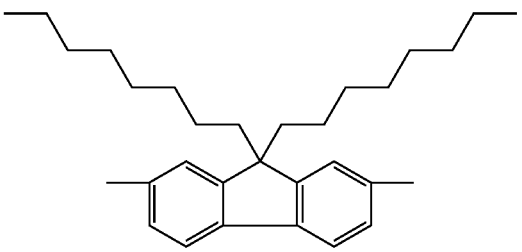 | 2 | 0 | —CH$_2$CH$_2$— |
| 58 | 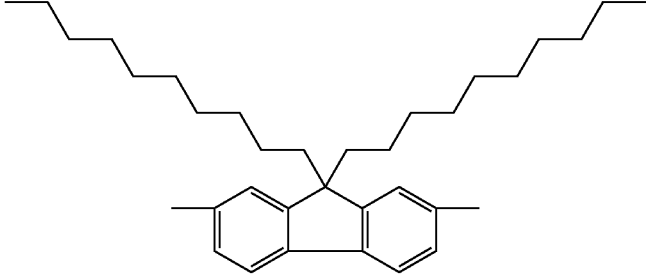 | 2 | 0 | —CH$_2$CH$_2$— |
| 59 | 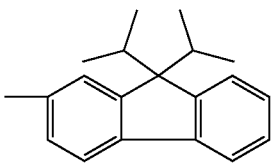 | 2 | 0 | —CH$_2$CH$_2$— |

TABLE 6-continued
| Structure | Ar | a | b | T |
|---|---|---|---|---|
| 60 | 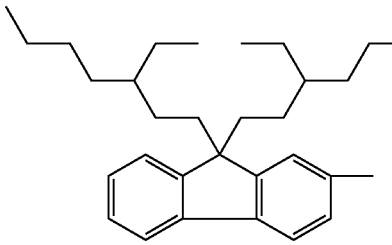 | 2 | 0 | 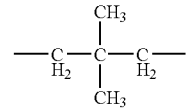 |
TABLE 7
| Structure | Ar | a | b | T |
|---|---|---|---|---|
| 61 | 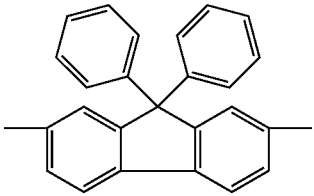 | 2 | 0 | —CH$_2$CH$_2$— |
| 62 | 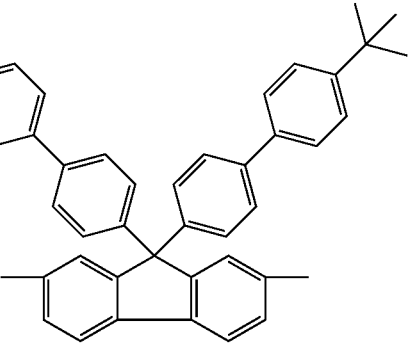 | 2 | 0 | —CH$_2$CH$_2$— |
| 63 | 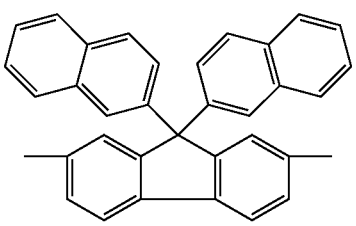 | 2 | 0 | —(CH$_2$)$_3$— |
| 64 | 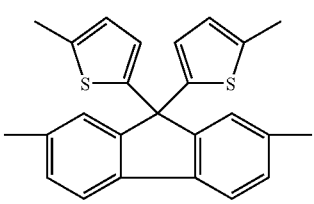 | 2 | 0 | —CH$_2$CH$_2$— |
| 65 | 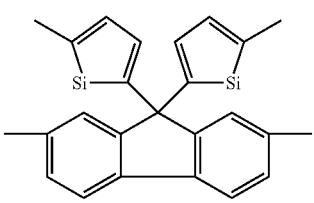 | 2 | 0 | 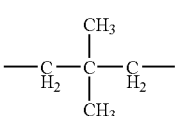 |

TABLE 7-continued

| Structure | Ar | a | b | T |
|---|---|---|---|---|
| 66 | (9,9-dimethylfluorene-2,7-diyl) | 2 | 1 | —CH$_2$CH$_2$— |
| 67 | (9,9-dipropylfluorene-2,7-diyl) | 2 | 1 | —CH$_2$CH$_2$— |
| 68 | (9,9-dipropylfluorene-2,7-diyl) | 2 | 1 | —CH$_2$CH$_2$— |
| 69 | (9,9-dibutylfluorene-2,7-diyl) | 2 | 1 | —CH$_2$CH$_2$— |
| 70 | (9,9-dihexylfluorene-2,7-diyl) | 2 | 1 | —CH$_2$CH$_2$— |

TABLE 8

| Structure | Ar | a | b | T |
|---|---|---|---|---|
| 71 | (9,9-dioctylfluorene-2,7-diyl) | 2 | 1 | —CH$_2$CH$_2$— |
| 72 | (9,9-didecylfluorene-2,7-diyl) | 2 | 1 | —CH$_2$CH$_2$— |

TABLE 8-continued

| Structure | Ar | a | b | T |
|---|---|---|---|---|
| 73 | (fluorene with 9,9-diisopropyl substituents) | 2 | 1 | —CH₂CH₂— |
| 74 | (fluorene with 9,9-bis(2-methylbutyl) substituents) | 2 | 1 | —CH₂CH₂— |
| 75 | (fluorene with 9,9-bis(2-ethylhexyl) substituents) | 2 | 1 | —CH₂CH₂— |
| 76 | (fluorene with 9,9-diphenyl substituents) | 2 | 1 | —CH₂CH₂— |
| 77 | (fluorene with 9,9-bis(4-tert-butylphenyl) substituents) | 2 | 1 | —CH₂CH₂— |
| 78 | (fluorene with 9,9-bis(4'-tert-butylbiphenyl) substituents) | 2 | 1 | —CH₂CH₂— |

TABLE 8-continued

| Structure | Ar | a | b | T |
|---|---|---|---|---|
| 79 | (dinaphthyl-substituted dimethylfluorene) | 2 | 1 | —CH₂CH₂— |
| 80 | (dipyrenyl-substituted dimethylfluorene) | 2 | 1 | —CH₂CH₂— |

TABLE 9

| Structure | Ar | a | b | T |
|---|---|---|---|---|
| 81 | (spirobifluorene) | 2 | 1 | —CH₂CH₂— |
| 82 | (dithienyl-substituted dimethylfluorene) | 2 | 1 | —CH₂CH₂— |
| 83 | (dithienyl-substituted silafluorene) | 2 | 1 | —CH₂CH₂— |
| 84 | (dithiazolyl-substituted dimethylfluorene) | 2 | 1 | —CH₂CH₂— |

TABLE 9-continued
| Structure | Ar | a | b | T |
|---|---|---|---|---|
| 85 | 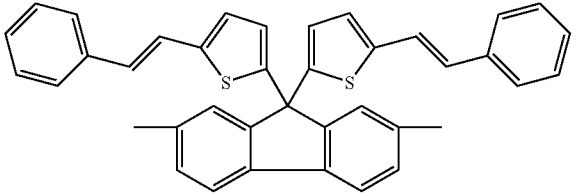 | 2 | 1 | —(CH$_2$)$_4$— |
| 86 | 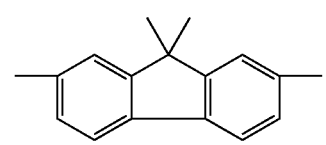 | 2 | 2 | $-\underset{H_2}{C}-\underset{\underset{CH_3}{\overset{CH_3}{|}}}{C}-\underset{H_2}{C}-$ |
| 87 | 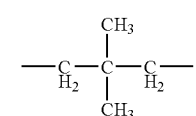 | 2 | 2 | —CH$_2$CH$_2$— |
| 88 | 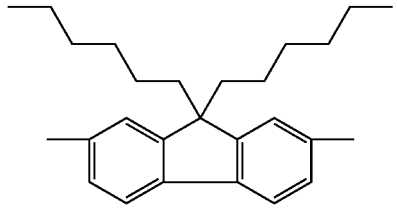 | 2 | 2 | —CH$_2$CH$_2$— |
| 89 | 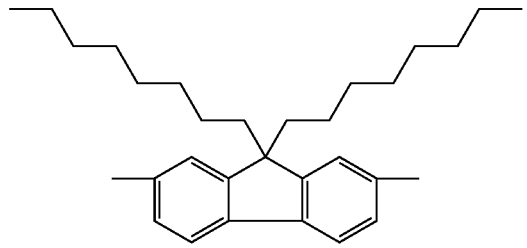 | 2 | 2 | —CH$_2$— |
| 90 | 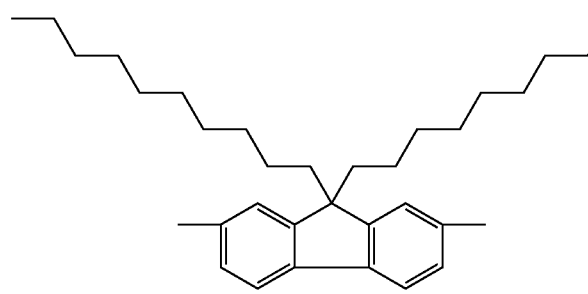 | 2 | 2 | —CH$_2$CH$_2$— |

TABLE 10

| Structure | Ar | a | b | T |
|---|---|---|---|---|
| 91 | (9,9-bis(2-methylbutyl)-2,7-fluorenyl) | 2 | 2 | —CH$_2$CH$_2$— |
| 92 | (9,9-bis(3-methylbutyl)-2,7-fluorenyl) | 2 | 2 | —CH$_2$CH$_2$— |
| 93 | (9,9-bis(4-tert-butylphenyl)-2,7-fluorenyl) | 2 | 2 | —CH$_2$CH$_2$— |
| 94 | (9,9-bis(5-methylthien-2-yl)-2,7-fluorenyl) | 2 | 2 | $-\underset{H_2}{C}-\underset{\underset{CH_3}{\overset{CH_3}{|}}}{C}-\underset{H_2}{C}-$ |
| 95 | (bis-silyl thiophene fluorenyl) | 2 | 2 | —CH$_2$— |
| 96 | (9,9-dihexyl-2,7-fluorenyl) | 2 | 3 | —CH$_2$CH$_2$— |

TABLE 10-continued

| Structure | Ar | a | b | T |
|---|---|---|---|---|
| 97 | (9,9-di-n-heptyl-fluorene-2,7-diyl) | 2 | 3 | —CH$_2$CH$_2$— |
| 98 | (9,9-diisopropyl-fluorene-2,7-diyl) | 2 | 3 | —CH$_2$CH$_2$— |
| 99 | (9,9-diisopentyl-fluorene-2,7-diyl) | 2 | 3 | —CH$_2$CH$_2$— |
| 100 | (9,9-bis(4-tert-butylphenyl)-fluorene-2,7-diyl) | 2 | 3 | —CH$_2$CH$_2$— |

TABLE 11

| Structure | Ar | a | b | T |
|---|---|---|---|---|
| 101 | (9,9-dimethyl-fluorene-2,7-diyl) | 3 | 0 | —CH$_2$— |
| 102 | (9,9-diethyl-fluorene-2,7-diyl) | 3 | 0 | —CH$_2$— |
| 103 | (9,9-di-n-propyl-fluorene-2,7-diyl) | 3 | 0 | —CH$_2$CH$_2$— |

TABLE 11-continued
| Structure | Ar | a | b | T |
|---|---|---|---|---|
| 104 | 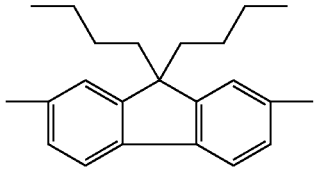 | 3 | 0 | —CH$_2$— |
| 105 | 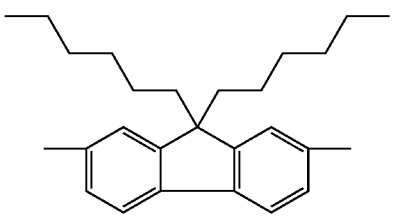 | 3 | 0 | —CH$_2$CH$_2$— |
| 106 | 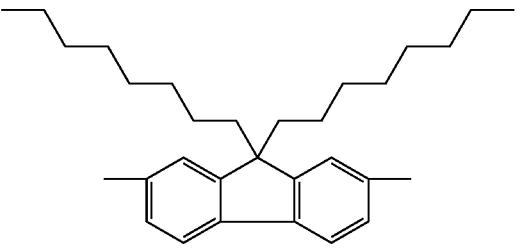 | 3 | 0 | —CH$_2$CH$_2$— |
| 107 | 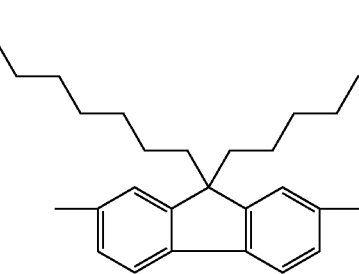 | 3 | 0 | 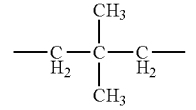 |
| 108 | 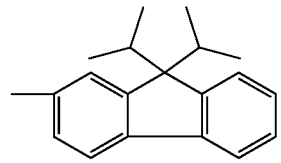 | 3 | 0 | —CH$_2$CH$_2$— |
| 109 | 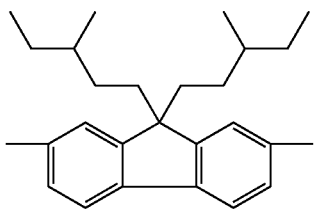 | 3 | 0 | —CH$_2$— |

TABLE 11-continued

| Structure | Ar | a | b | T |
|---|---|---|---|---|
| 110 | (2,7-disubstituted 9,9-bis(2-butylhexyl)fluorene) | 3 | 0 | —CH$_2$— |

TABLE 12

| Structure | Ar | a | b | T |
|---|---|---|---|---|
| 111 | (2,7-disubstituted 9,9-diphenylfluorene) | 3 | 0 | —CH$_2$CH$_2$— |
| 112 | (2,7-disubstituted 9,9-bis(4'-tert-butylbiphenyl-4-yl)fluorene) | 3 | 0 | —CH$_2$CH$_2$— |
| 113 | (2,7-disubstituted 9,9-di(naphthalen-2-yl)fluorene) | 3 | 0 | —CH$_2$CH$_2$— |
| 114 | (2,7-disubstituted 9,9-bis(5-methylthiophen-2-yl)fluorene) | 3 | 0 | —CH$_2$CH$_2$— |
| 115 | (2,7-disubstituted 9,9-bis(5-methylthiophen-2-yl)-silafluorene) | 3 | 0 | —CH$_2$CH$_2$— |

TABLE 12-continued

| Structure | Ar | a | b | T |
|---|---|---|---|---|
| 116 | (9,9-dimethylfluorene-2,7-diyl) | 3 | 1 | —CH$_2$CH$_2$— |
| 117 | (9,9-diethylfluorene-2,7-diyl) | 3 | 1 | —CH$_2$CH$_2$— |
| 118 | (9,9-dipropylfluorene-2,7-diyl) | 3 | 1 | —CH$_2$CH$_2$— |
| 119 | (9,9-dibutylfluorene-2,7-diyl) | 3 | 1 | —CH$_2$CH$_2$— |
| 120 | (9,9-dihexylfluorene-2,7-diyl) | 3 | 1 | —CH$_2$CH$_2$— |

TABLE 13

| Structure | Ar | a | b | T |
|---|---|---|---|---|
| 121 | (9,9-diheptylfluorene-2,7-diyl) | 3 | 1 | —CH$_2$CH$_2$— |
| 122 | (9,9-dioctylfluorene-2,7-diyl) | 3 | 1 | —CH$_2$CH$_2$— |

TABLE 13-continued

| Structure | Ar | a | b | T |
|---|---|---|---|---|
| 123 | (2-substituted 9,9-diisopropyl-fluorene) | 3 | 1 | —CH₂CH₂— |
| 124 | (2,7-disubstituted 9,9-bis(2-methylbutyl)fluorene) | 3 | 1 | —CH₂—C(CH₃)₂—CH₂— |
| 125 | (2-substituted 9,9-bis(2-ethylhexyl)fluorene) | 3 | 1 | —CH₂CH₂— |
| 126 | (2,7-disubstituted 9,9-diphenylfluorene) | 3 | 1 | —CH₂CH₂— |
| 127 | (2,7-disubstituted 9,9-bis(4-tert-butylphenyl)fluorene) | 3 | 1 | —CH₂— |
| 128 | (2,7-disubstituted 9,9-bis(4'-tert-butylbiphenyl)fluorene) | 3 | 1 | —CH₂CH₂— |

TABLE 13-continued

| Structure | Ar | a | b | T |
|---|---|---|---|---|
| 129 | (dinaphthyl-fluorene) | 3 | 1 | —CH$_2$CH$_2$— |
| 130 | (dipyrenyl-fluorene) | 3 | 1 | —CH$_2$CH$_2$— |

TABLE 14

| Structure | Ar | a | b | T |
|---|---|---|---|---|
| 131 | (spirobifluorene) | 3 | 1 | —CH$_2$CH$_2$— |
| 132 | (dithienyl-fluorene) | 3 | 1 | —CH$_2$— |
| 133 | (dithienyl-silafluorene) | 3 | 1 | —CH$_2$—C(CH$_3$)$_2$—CH$_2$— |
| 134 | (dithiazolyl-fluorene) | 3 | 1 | —CH$_2$CH$_2$— |

TABLE 14-continued

| Structure | Ar | a | b | T |
|---|---|---|---|---|
| 135 | (2,2'-bi(5-styrylthiophene)-substituted 9,9-difluorene) | 3 | 1 | —CH$_2$CH$_2$— |
| 136 | 9,9-dimethylfluorene-2,7-diyl | 3 | 2 | —CH$_2$CH$_2$— |
| 137 | 9,9-dihexylfluorene-2,7-diyl | 3 | 2 | —CH$_2$CH$_2$— |
| 138 | 9,9-dioctylfluorene-2,7-diyl | 3 | 2 | —CH$_2$CH$_2$— |
| 139 | 9,9-didecylfluorene-2,7-diyl | 3 | 2 | —CH$_2$CH$_2$— |
| 140 | 9,9-diisopropylfluorene-2,7-diyl | 3 | 2 | —CH$_2$CH$_2$— |

TABLE 15

| Structure | Ar | a | b | T |
|---|---|---|---|---|
| 141 | (fluorene with 2-methylbutyl groups at 9,9-position) | 3 | 2 | —CH$_2$CH$_2$— |
| 142 | (fluorene with 4-methylpentyl groups at 9,9-position) | 3 | 2 | —CH$_2$CH$_2$— |
| 143 | (fluorene with two 4-tert-butylphenyl groups at 9,9-position) | 3 | 2 | —CH$_2$CH$_2$— |
| 144 | (fluorene with two 5-methylthiophen-2-yl groups at 9,9-position) | 3 | 2 | —CH$_2$CH$_2$— |
| 145 | (silafluorene with two 5-methylthiophen-2-yl groups at 9,9-position) | 3 | 2 | —CH$_2$CH$_2$— |
| 146 | (fluorene with two n-hexyl groups at 9,9-position) | 3 | 2 | —CH$_2$CH$_2$— |

TABLE 15-continued

| Structure | Ar | a | b | T |
|---|---|---|---|---|
| 147 | (9,9-di-n-heptyl-fluorene-2,7-diyl) | 3 | 2 | —CH$_2$CH$_2$— |
| 148 | (9,9-diisopropyl-fluorene-2,7-diyl) | 3 | 3 | —CH$_2$CH$_2$— |
| 149 | (9,9-bis(4-methylpentyl)-fluorene-2,7-diyl) | 3 | 3 | —CH$_2$CH$_2$— |
| 150 | (9,9-bis(4-tert-butylphenyl)-fluorene-2,7-diyl) | 3 | 3 | —CH$_2$CH$_2$— |

TABLE 16

| Structure | Ar | a | b | T |
|---|---|---|---|---|
| 151 | (9,9-dimethyl-fluorene-2,7-diyl) | 4 | 0 | —CH$_2$CH$_2$— |
| 152 | (9,9-diethyl-fluorene-2,7-diyl) | 4 | 0 | —CH$_2$CH$_2$— |
| 153 | (9,9-di-n-propyl-fluorene-2,7-diyl) | 4 | 0 | —CH$_2$CH$_2$— |

TABLE 16-continued
| Structure | Ar | a | b | T |
|---|---|---|---|---|
| 154 | 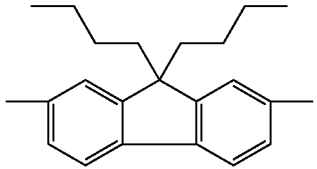 | 4 | 0 | —CH$_2$CH$_2$— |
| 155 | 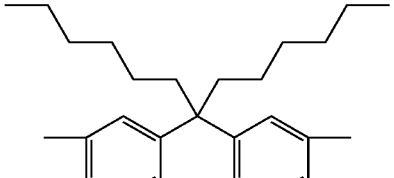 | 4 | 0 | —CH$_2$CH$_2$— |
| 156 | 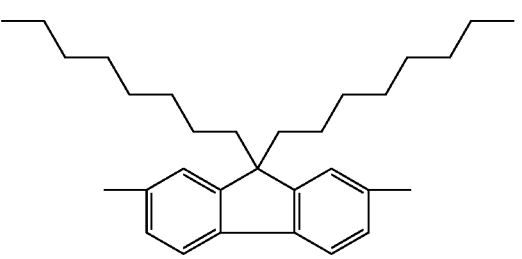 | 4 | 0 | —CH$_2$CH$_2$— |
| 157 | 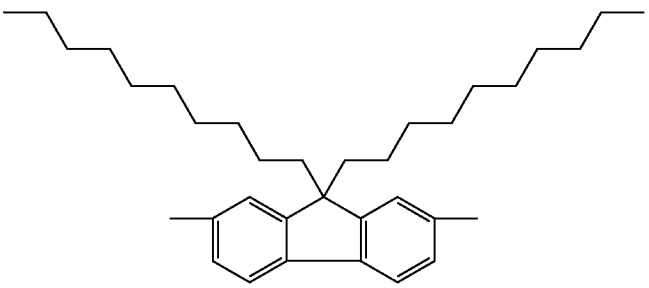 | 4 | 0 | —CH$_2$— |
| 158 | 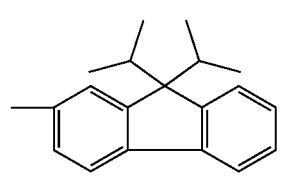 | 4 | 0 | —CH$_2$CH$_2$— |
| 159 | 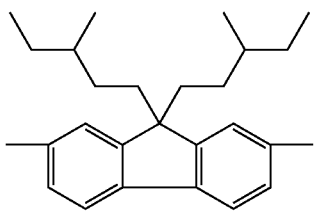 | 4 | 0 | —CH$_2$CH$_2$— |

TABLE 16-continued

| Structure | Ar | a | b | T |
|---|---|---|---|---|
| 160 | (fluorene with two 2-ethylhexyl groups at 9-position) | 4 | 0 | —CH$_2$CH$_2$— |

TABLE 17

| Structure | Ar | a | b | T |
|---|---|---|---|---|
| 161 | (9,9-diphenylfluorene) | 4 | 0 | —CH$_2$CH$_2$— |
| 162 | (9,9-bis(4'-tert-butylbiphenyl-4-yl)fluorene) | 4 | 0 | —CH$_2$CH$_2$— |
| 163 | (9,9-di(2-naphthyl)fluorene) | 4 | 0 | —CH$_2$CH$_2$— |
| 164 | (9,9-bis(thienyl)fluorene) | 4 | 0 | —CH$_2$CH$_2$— |
| 165 | (9,9-bis(silylthienyl)fluorene) | 4 | 0 | —CH$_2$CH$_2$— |

TABLE 17-continued

| Structure | Ar | a | b | T |
|---|---|---|---|---|
| 166 | (9,9-dimethylfluorene-2,7-diyl) | 4 | 1 | —CH$_2$CH$_2$— |
| 167 | (9,9-dipropyl-fluorene-2,7-diyl) | 4 | 1 | —CH$_2$CH$_2$— |
| 168 | (9,9-dipropyl-fluorene-2,7-diyl) | 4 | 1 | —CH$_2$CH$_2$— |
| 169 | (9,9-dibutyl-fluorene-2,7-diyl) | 4 | 1 | —CH$_2$CH$_2$— |
| 170 | (9,9-dihexyl-fluorene-2,7-diyl) | 4 | 1 | —CH$_2$— |

TABLE 18

| Structure | Ar | a | b | T |
|---|---|---|---|---|
| 171 | (9,9-dihexyl-fluorene-2,7-diyl) | 4 | 1 | —CH$_2$CH$_2$— |
| 172 | (9,9-dioctyl-fluorene-2,7-diyl) | 4 | 1 | —CH$_2$CH$_2$— |

TABLE 18-continued

| Structure | Ar | a | b | T |
|---|---|---|---|---|
| 173 | (2,7-substituted 9,9-diisopropylfluorene) | 4 | 1 | —CH₂CH₂— |
| 174 | (2,7-substituted 9,9-bis(2-methylbutyl)fluorene) | 4 | 1 | —CH₂CH₂— |
| 175 | (2,7-substituted 9,9-bis(2-ethylhexyl)fluorene) | 4 | 1 | —CH₂— |
| 176 | (2,7-substituted 9,9-diphenylfluorene) | 4 | 1 | —CH₂— |
| 177 | (2,7-substituted 9,9-bis(4-tert-butylphenyl)fluorene) | 4 | 1 | —CH₂CH₂— |
| 178 | (2,7-substituted 9,9-bis(4'-tert-butylbiphenyl)fluorene) | 4 | 1 | $-\underset{H_2}{C}-\underset{\underset{CH_3}{\overset{CH_3}{\vert}}}{C}-\underset{H_2}{C}-$ |

TABLE 18-continued

| Structure | Ar | a | b | T |
|---|---|---|---|---|
| 179 | (dinaphthyl-substituted fluorene) | 4 | 1 | —CH$_2$CH$_2$— |
| 180 | (dipyrenyl-substituted fluorene) | 4 | 1 | —CH$_2$CH$_2$— |

TABLE 19

| Structure | Ar | a | b | T |
|---|---|---|---|---|
| 181 | (spirobifluorene) | 4 | 1 | —CH$_2$CH$_2$— |
| 182 | (dithienyl-substituted fluorene) | 4 | 1 | —CH$_2$CH$_2$— |
| 183 | (dithienyl-substituted silafluorene) | 4 | 1 | —CH$_2$CH$_2$— |
| 184 | (dithiazolyl-substituted fluorene) | 4 | 1 | —CH$_2$CH$_2$— |

TABLE 19-continued

| Structure | Ar | a | b | T |
|---|---|---|---|---|
| 185 | (fluorene with two thienyl-styryl substituents at 9,9 positions; 2,7-linked) | 4 | 1 | —CH$_2$CH$_2$— |
| 186 | (9,9-dimethylfluorene, 2,7-linked) | 4 | 2 | —CH$_2$CH$_2$— |
| 187 | (9,9-dihexylfluorene, 2,7-linked) | 4 | 2 | —(CH$_2$)$_3$— |
| 188 | (9,9-dioctylfluorene, 2,7-linked) | 4 | 2 | —CH$_2$CH$_2$— |
| 189 | (9,9-didecylfluorene, 2,7-linked) | 4 | 2 | —CH$_2$CH$_2$— |
| 190 | (9,9-diisopropylfluorene, 2,7-linked) | 4 | 2 | —CH$_2$CH$_2$— |

TABLE 20

| Structure | Ar | a | b | T |
|---|---|---|---|---|
| 191 | (2,7-disubstituted 9,9-bis(2-methylbutyl)fluorene) | 4 | 2 | —CH₂— |
| 192 | (2,7-disubstituted 9,9-bis(4-methylpentyl)fluorene) | 4 | 2 | —CH₂CH₂— |
| 193 | (2,7-disubstituted 9,9-bis(4-tert-butylphenyl)fluorene) | 4 | 2 | —CH₂CH₂— |
| 194 | (2,7-disubstituted 9,9-bis(5-methylthien-2-yl)fluorene) | 4 | 2 | —CH₂CH₂— |
| 195 | (2,7-disubstituted 9,9-bis(5-methylsilol-2-yl)fluorene) | 4 | 2 | —CH₂CH₂— |
| 196 | (2,7-disubstituted 9,9-dihexylfluorene) | 4 | 2 | —CH₂CH₂— |

TABLE 20-continued

| Structure | Ar | a | b | T |
|---|---|---|---|---|
| 197 | | 4 | 2 | —CH$_2$CH$_2$— |
| 198 | | 4 | 2 | —CH$_2$CH$_2$— |
| 199 | | 4 | 2 | —CH$_2$CH$_2$— |
| 200 | | 4 | 3 | —CH$_2$CH$_2$— |

As charge transporting polyesters having a repeating structure containing at least one structure selected from structures represented by the formula (I-1) as a partial structure, ones represented by the following formula (II-1) or formula (II-2) can be preferably used.

(In the formula (II-1) or formula (II-2), A$_1$ represents one or more structures selected from structures represented by the formula (I), Y$_1$ represents a divalent alcohol residue, Z$_1$ represents a divalent carboxylate residue, m represents an integer from 1 to 5, R$_3$ represents a group represented by —O—

(II-1)

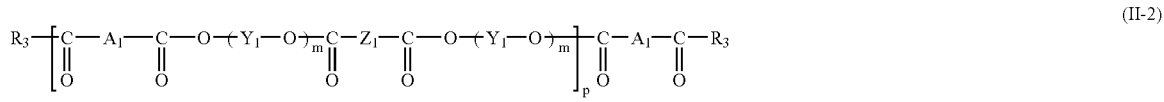

(II-2)

$(Y_1$—O)$_m$—H or —O—$(Y_1$—O)$_m$—CO—$Z_1$—CO—OR'
(here, $Y_1$, $Z_1$ and m have the same meanings as the above, and R' represents a hydrogen atom, alkyl group, substituted or unsubstituted aryl group, or substituted or unsubstituted aralkyl group.) and p represents an integer from 5 to 5000.)

In the formula (II-1) or (II-2), $A_1$ represents at least one structure selected from structures represented by the formula (I-1) and a plurality of $A_1$s present in the charge transporting polyesters represented by the formula (II-1) or formula (II-2) may have the same structure or different structures from each other.

In the formula (II-1) or formula (II-2), as $Y_1$ and $Z_1$, specifically, groups selected from formulas (1) through (6) below can be included.

—(CH$_2$)$_c$— (1)

—(CH$_2$CH$_2$O)$_d$—(CH$_2$CH$_2$)— (2)

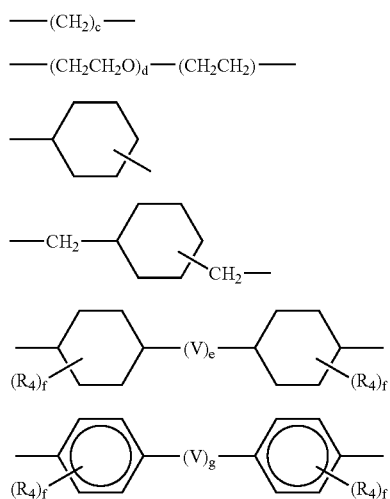

(3)

(4)

(5)

(6)

Here, in the formula, $R_4$ represents a hydrogen atom, alkyl group having 1 to 20 carbon atoms, alkoxy group having 1 to 4 carbon atoms, substituted or unsubstituted phenyl group, substituted or unsubstituted aralkyl group or halogen atom (substitution groups capable of substituting the respective groups are identical as the foregoing substitution groups). Signs c and d, respectively, represent an integer from 1 to 10, signs e and g, respectively, mean 0 or 1, a sign f represents an integer from 0 to 6, and, as V, a group selected from (7) to (17) below can be included.

—(CH$_2$)$_h$— (7)

—C(CH$_3$)$_2$— (8)

—O— (9)

—S— (10)

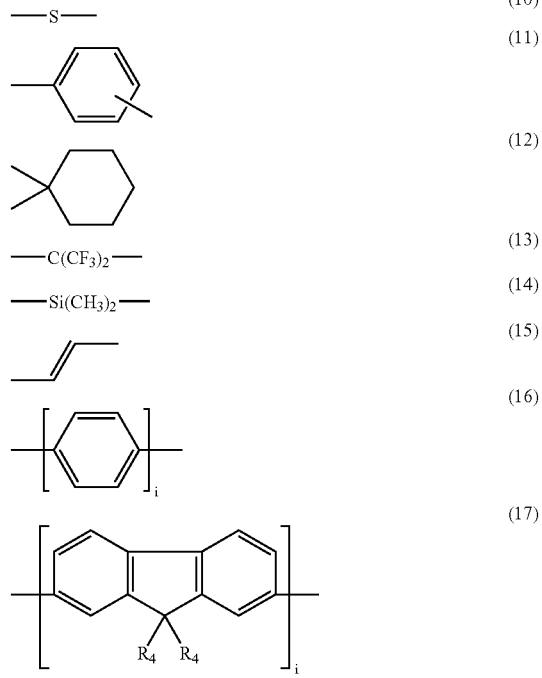

—C(CF$_3$)$_2$— (13)

—Si(CH$_3$)$_2$— (14)

(15)

(16)

(17)

Here, in the formula, signs h and i, respectively, represent an integer from 1 to 10. $R_4$ has the same meaning as that mentioned above.

In what follows, specific examples of the polyesters represented by the formula (II-1) or formula (II-2) are shown. However, the exemplary embodiment of the invention is not restricted thereto.

In tables below, numbers in a $A_1$ column of a monomer row correspond to the structural numbers of the specific examples of the structures represented by the formula (I-1). Furthermore, ones in a $Z_1$ column of which "-" is represented show specific examples of charge transporting polyesters represented by the formula (II-1) and others show specific examples of charge transporting polyesters represented by the formula (II-2). In tables below, as to respective specific examples of charge transporting polyesters assigned with compound numbers, for instance, a specific example assigned with a number of 15 is called "exemplified compound (15)". Furthermore, an end group $R_3$ represents a group expressed by —O—$(Y_1$—O)$_m$-H or —O—$(Y_1$—O)$_m$-CO—$Z_1$—CO—OR' (here, $Y_1$, $Z_1$ and m have the same meanings as the above, and R' represents a hydrogen atom, alkyl group, substituted or unsubstituted aryl group or substituted or unsubstituted aralkyl group).

TABLE 21

| Compound | Monomer | | $Y_1$ | $Z_1$ | m | p |
| --- | --- | --- | --- | --- | --- | --- |
| | $A_1$ | Ratio | | | | |
| (1) | 1 | — | —CH$_2$CH$_2$— | — | 1 | 80 |
| (2) | 2 | — | —CH$_2$CH$_2$— |  | 1 | 75 |

TABLE 21-continued
| Compound | Monomer A₁ | Ratio | Y₁ | Z₁ | m | p |
|---|---|---|---|---|---|---|
| (3) | 3 | — | —CH₂CH₂— | — | 1 | 110 |
| (4) | 4 | — | —CH₂CH₂— |  | 1 | 102 |
| (5) | 5 | — | —CH₂CH₂— | — | 1 | 93 |
| (6) | 8 | — | —CH₂CH₂— | — | 2 | 82 |
| (7) | 10 | — | —CH₂CH₂— | — | 1 | 75 |
| (8) | 11 | — | —CH₂CH₂— | — | 1 | 63 |
| (9) | 12 | — | 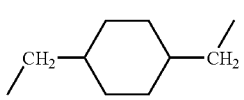 | — | 1 | 88 |
| (10) | 14 | — | —CH₂CH₂— | — | 1 | 79 |
| (11) | 16 | — | —CH₂CH₂— | — | 1 | 102 |
| (12) | 28 | — | —CH₂CH₂— | — | 1 | 109 |
| (13) | 35 | — | —CH₂CH₂— | — | 1 | 89 |
| (14) | 40 | — | —CH₂CH₂— | — | 1 | 79 |
| (15) | 41 | — | —CH₂CH₂— |  | 2 | 84 |
| (16) | 43 | — | —CH₂CH₂— | — | 1 | 111 |
| (17) | 51 | — | —CH₂CH₂— | — | 1 | 119 |
| (18) | 52 | — | —(CH₂)₄— |  | 2 | 125 |
| (19) | 53 | — | 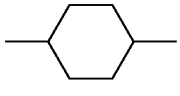 | — | 1 | 136 |
| (20) | 55 | — |  | — | 1 | 75 |
| (21) | 68 | — | 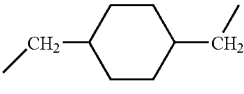 | — | 1 | 79 |
| (22) | 70 | — | —CH₂CH₂— | — | 1 | 82 |
TABLE 22
| Compound | Monomer A₁ | Ratio | Y₁ | Z₁ | m | p |
|---|---|---|---|---|---|---|
| (23) | 92 | — | —CH₂CH₂— | 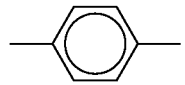 | 1 | 89 |
| (24) | 94 | — | 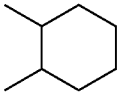 | — | 1 | 106 |
| (25) | 101 | — | —CH₂CH₂— | — | 1 | 117 |

TABLE 22-continued
| Compound | Monomer A₁ | Ratio | Y₁ | Z₁ | m | p |
|---|---|---|---|---|---|---|
| (26) | 102 | — | 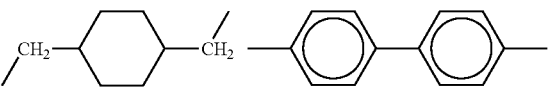 | 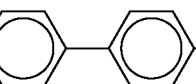 | 1 | 106 |
| (27) | 105 | — | —CH₂CH₂— | — | 2 | 105 |
| (28) | 116 | — | —CH₂CH₂— | — | 1 | 116 |
| (29) | 117 | — | —CH₂CH₂— |  | 1 | 115 |
| (30) | 119 | — |  | — | 1 | 98 |
| (31) | 120 | — | —CH₂CH₂— | — | 1 | 94 |
| (32) | 137 | — | 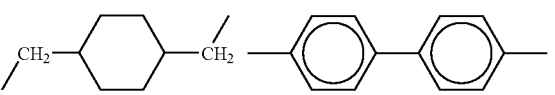 | 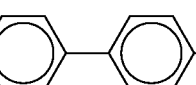 | 1 | 69 |
| (33) | 139 | — | —CH₂CH₂— | — | 1 | 69 |
| (34) | 140 | — | —CH₂CH₂— | 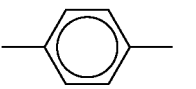 | 1 | 118 |
| (35) | 142 | — | —CH₂CH₂— | — | 1 | 114 |
| (36) | 146 | — | —CH₂CH₂— | — | 1 | 111 |
| (37) | 148 | — | —CH₂CH₂— | — | 1 | 98 |
| (38) | 151 | — | —CH₂CH₂— | — | 1 | 99 |
| (39) | 153 | — | —CH₂CH₂— | 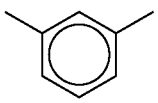 | 1 | 92 |
| (40) | 156 | — | —CH₂CH₂— | — | 1 | 79 |
| (41) | 159 | — | —CH₂CH₂— | — | 1 | 110 |
| (42) | 160 | — | —CH₂CH₂— | — | 1 | 89 |
| (43) | 162 | — | —CH₂CH₂— | — | 1 | 111 |
| (44) | 163 | — | —CH₂CH₂— | — | 1 | 79 |
TABLE 23
| Compound | Monomer A₁ | Ratio | Y₁ | Z₁ | m | p |
|---|---|---|---|---|---|---|
| (45) | 168 | — | —CH₂CH₂— | — | 1 | 84 |
| (46) | 170 | — | —CH₂CH₂— | — | 1 | 74 |
| (47) | 171 | — | —CH₂CH₂— | — | 1 | 87 |
| (48) | 172 | — |  | — | 1 | 94 |
| (49) | 175 | — | —CH₂CH₂— |  | 1 | 93 |
| (50) | 176 | — | —CH₂CH₂— | — | 1 | 140 |

TABLE 23-continued

| Compound | Monomer A₁ | Ratio | Y₁ | Z₁ | m | p |
|---|---|---|---|---|---|---|
| (51) | 185 | — |  | — | 2 | 119 |
| (52) | 189 | — | —CH₂CH₂— | — | 1 | 105 |
| (53) | 192 | — | —CH₂CH₂— |  | 1 | 108 |
| (54) | 7/9 | 1/1 | 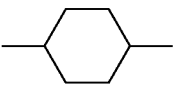 | — | 1 | 70 |
| (55) | 7/20 | 1/1 | —CH₂CH₂— | — | 1 | 62 |
| (56) | 7/35 | 1/1 | 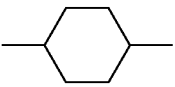 | — | 1 | 69 |
| (57) | 7/50 | 1/1 | —CH₂CH₂— | — | 1 | 89 |
| (58) | 7/80 | 1/1 | —CH₂CH₂— | — | 1 | 81 |
| (59) | 7/95 | 1/1 | —CH₂CH₂— | — | 1 | 84 |
| (60) | 7/138 | 1/1 | —CH₂CH₂— | — | 1 | 73 |
| (61) | 5/7/150 | 1/1/1 | —CH₂CH₂— | 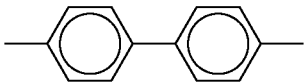 | 1 | 55 |
| (62) | 5/7/120 | 1/1/1 |  | — | 1 | 56 |
| (63) | 58/125 | 1/1 | —CH₂CH₂— |  | 1 | 59 |
| (64) | 58/183 | 1/2 | —CH₂CH₂— | — | 1 | 69 |
| (65) | 58/196 | 2/1 | —CH₂CH₂— | — | 1 | 60 |

In the exemplary embodiment a weight average molecular weight Mw of the charge transporting polyester is in the range of from 5,000 to 300,000. Furthermore, the glass transition point (Tg) of the charge transporting polyester is 60° C. or more.

The weight average molecular weight Mw can be measured according to a method below. That is, a THF solution of 1.0 mass percent of the charge transporting polyester is prepared, by use of a differential refractive index detector (RI), according to gel permeation chromatography (GPC), with styrene polymer as a reference sample, a weight average molecular weight is measured.

The glass transition point can be measured in such a manner that, by use of a differential scanning thermometer, with α-Al₂O₃ as a reference sample, a sample is heated to a temperature where a rubber state is obtained, followed by quenching by dipping in liquid nitrogen, further followed by once more heating at a temperature rise speed of 10° C./min to measure.

In what follows, a synthesis method of the charge transporting polyester will be described.

As a synthesis method of the charge transporting polyester, according to a desired structure, without restricting particularly, known methods can be combined to use. As a specific example, a case where a charge transporting polyester having a repeating unit that contains at least one structure from structures represented by the formula (I-1) as a partial structure is a polyester such as represented by the following formula (II-1) or formula (II-2) will be detailed.

When the charge transporting polyester is a charge transporting polyester such as represented by the formula (II-1) or formula (II-2), a monomer represented by the following formula (I-2) can be polymerized to synthesize according to a known method described in, for instance, 4$^{th}$ edition, Jikken Kagaku Koza 28, (Maruzen, 1992).

$$A'\text{-}A_1\text{-}A' \qquad (I\text{-}2)$$

In the formula (I-2), $A_1$ represents at least one structure selected from structures represented by the formula (I-1), A' represents a hydroxyl group, halogen atom or —O—$R_5$ group and $R_5$ represents an alkyl group, substituted or unsubstituted aryl group, or aralkyl group.

Specifically, monomers represented by the formula (I-2) can be synthesized, for instance, as follows.

In the beginning, thiophene having a halogen body at positions 3 and 4 and halogenated alkyl(perfluorohalogen or alkyl magnesium bromide) are reacted (reference literatures: J. Org. Chem., 62, 7128 (1997), J. Fluorine Chem., 27, 291 (1985) and Tetrahedron, 38, 3347 (1982)). Subsequently, positions 2 and 3 are halogenated to obtain mono-halogenated thiophene and dihalogenated thiophene (reference literatures: Bull. Chem. Soc. Jpn., 64, 2566 (1991) and Chem. Mater., 6, 401 (1994)). With these, multimeric thiophene is obtained (reference literatures: J. Am. Chem. Soc., 117, 232 (1995) and Chem. Mater., 6, 401 (1994)) and similarly to the above procedure a dihalogen body is obtained. When these and acrylic acid ester are reacted with a catalyst such as a palladium complex, $A_1$ can be obtained (reference literatures: J. Am. Chem. Soc., 121, 2123 (1995) and $4^{th}$ edition, Jikken Kagaku Koza 25, 396 (Maruzen, 1992)).

Furthermore, when halogenated carboalkoxyalkylbenzene and thiophene-diboronic acid are reacted as well, a monomer represented by the formula (I-2) can be obtained. Still furthermore, when the dihalogenated thiophene and methyl-3-[4, (4,4,5,5-tetramethyl-[1,3,2]dioxy bororan)phenyl]propinate or 3-(4-dihydroxybororylphenyl)propionic acid (reference literature: J. Organometallic Chem., 657, 129 (2002)) are reacted as well, a monomer represented by the formula (I-2) can be obtained. The obtained compound may be purified by silica gel column chromatography and recrystallization. The synthesis method of the monomer represented by the formula (I-2) is not restricted thereto.

From the monomers represented by the formula (I-2), the charge transporting polyester can be synthesized as follows.

When the A' is a hydroxyl group, the monomer and a substantially equivalent amount of secondary alcohol represented by HO—$(Y_1$—$O)_m$—H (here, $Y_1$ and m are same as the $Y_1$ and m in the formula (II-1) or formula (II-2), same below) are blended and polymerized with an acid catalyst. As the acid catalyst, ones such as sulfuric acid, toluene sulfonic acid and trifluoroacetic acid that are used in an ordinary esterification reaction can be used at an amount, to 1 parts by weight of the monomer, in a range of from 1/10,000 to 1/10 parts by weight and preferably in a range of from 1/1,000 to 1/50 parts by weight. In order to remove water generated during the polymerization, a solvent such as toluene, chlorobenzene or 1-chloronaphthalene that is azeotropic with water is preferably used at an amount, to 1 parts by weight of the monomer, in a range of from 1 to 100 parts by weight and preferably in a range of from 2 to 50 parts by weight. A reaction temperature can be optionally set. However, in order to remove water generated during the polymerization, it is preferred to carry out a reaction at the boiling temperature of the solvent.

After completion of the reaction, the reaction solution is dropwisely added to a poor solvent in which a polymer is hardly dissolved, such as alcohols such as methanol, ethanol and the like, acetone and the like, and polyurethane is precipitated and separated from the reaction solution, washed with water or an organic solvent well, and is dried. Further, if necessary, re-precipitating treatment may be repeated in which polyurethane is dissolved in a suitable organic solvent, and the solution is added dropwise to a poor solvent, to precipitate polyurethane. Upon re-precipitated treatment, it is preferable to perform the treatment while effectively stirring with a mechanical stirrer or the like. A solvent which dissolves polyurethane upon re-precipitating treatment is used in a range of from 1 to 100 parts by weight, preferably from 2 to 50 parts by weight relative to 1 part by weight of polyurethane. In addition, a poor solvent is used in a range of from 1 to 1,000 parts by weight, preferably from 10 to 500 parts by weight relative to 1 part by weight of charge transporting polyurethane.

In the case of the A' being —O—$R_5$, when the monomer and secondary alcohol represented by HO—$(Y_1$—$O)_m$—H in excess to the monomer are heated in the presence of a catalyst such as an inorganic acid such as sulfuric acid or phosphoric acid, titanium alkoxide, an acetate or carbonate of calcium or cobalt or an oxide of zinc or lead, a charge transporting polyester can be synthesized according to an ester exchange. The secondary alcohol is used, to 1 equivalent of the monomer, in a range of from 2 to 100 equivalents and preferably in a range of from 3 to 50 equivalents. The catalyst is used, to 1 parts by weight of the monomer, in a range of from 1/10,000 to 1 parts by weight and preferably in a range of from 1/1,000 to 1/2 parts by weight. The reaction is carried out at a temperature in a range of from 200 to 300° C. After an ester exchange from a —O—$R_6$ group to a —O—$(Y_1$—$O)_m$—H group comes to completion, in order to accelerate the polymerization due to elimination of HO—$(Y_1$—$O)_m$—H, the reaction is preferably carried out under reduced pressure. Furthermore, with a high boiling temperature solvent such as 1-chloronaphthalene that is azeotropic with HO—$(Y_1$—$O)_m$—H, while azeotropically removing HO—$(Y_1$—$O)_m$—H under normal pressure, the reaction can be carried out.

Furthermore, a charge transporting polyester can be synthesized as follows as well. In the forgoing respective cases, after secondary alcohol is excessively added and reacted to synthesize a compound represented by the following formula (I-3), with the compound used in place of the monomer represented by the formula (I-2), according to a method similar to the above (a case where A' is —O—$R_5$), the compound may be reacted with divalent carboxylic acid or divalent halogenated carboxylate, and thereby a polyester can be obtained.

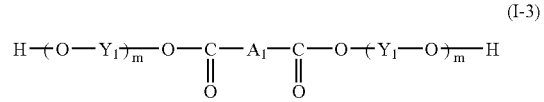

(I-3)

In the formula (I-3), $A_1$ represents one or more structures selected from structures represented by the formula (I-1), $Y_1$ represents a divalent alcohol residue and m represents an integer from 1 to 5.

Furthermore, an arbitrary molecule may be introduced in an end of the charge transporting polyester. In this case, methods such as mentioned below can be included. That is, when A' of the monomer represented by the formula (I-2) is a hydroxyl group, monocarboxylic acid of a compound that is introduced at an end is copolymerized to introduce or monocarboxylic acid is added to a compound after the polymerization reaction of the polymer to react to introduce.

Still furthermore, when the A' is halogen, monoacid chloride of a compound that is introduced at an end is copolymerized to introduce or, after the polymerization reaction of the polymer, a monoacid chloride of a compound that is introduced at an end is added and reacted to introduce. When the A' is —O—$R_5$, a monoester of a compound that is introduced at an end is copolymerized to introduce or after the polymerization reaction of the polymer, monoester of a compound that is introduced at an end is added to react to introduce.

In the next place, a configuration of an organic electroluminescent device in the exemplary embodiment of the invention will be detailed.

An organic electroluminescent device in an exemplary embodiment, as far as it is constituted including: a pair of electrodes at least one of which is transparent or translucent; and one or more organic compound layers interposed between the pair of electrodes, wherein at least one layer selected from the organic compound layers contains at least one charge transporting polyesters such as described above, is not particularly restricted in a layer configuration thereof.

When the organic electroluminescent device of in an exemplary embodiment has one organic compound layer, the organic compound layer means a luminescent layer having the charge transportability and the luminescent layer is constituted including the charge transporting polyester. On the other hand, when the organic compound layer has a plurality of layers (that is, a case of a function separated type where the respective layers have functions different from each other), at least one of the layers has if a luminescent layer, and the luminescent layer may be a luminescent layer having the charge transportability. In this case, as specific examples of layer having the luminescent layer or the luminescent layer having the charge transportability and other layers, the following (1) through (3) can be included.

(1) A layer configuration having a luminescent layer and at least one layer selected from an electron transport layer or an electron injection layer.

(2) A layer configuration having at least one layer selected from a hole transport layer or a hole injection layer, a luminescent layer and at least one layer selected from an electron transport layer or an electron injection layer.

(3) A layer configuration having at least one layer selected from a hole transport layer or a hole injection layer, and a luminescent layer.

Layers other than the luminescent layer and the luminescent layer having the charge transportability of the layer configurations (1) through (3) have a function of a charge transport layer or a charge injection layer.

In all layer configurations of the layer configurations (1) through (3), any one layer thereof may contain the charge transporting polyester.

Furthermore, in the organic electroluminescent device of in an exemplary embodiment, the luminescent layer, hole transport layer, hole injection layer, electron transport layer and electron injection layer may further contain a charge transporting compound (hole transport material, electron transport material) other than the charge transporting polyester. Such charge transporting compounds will be detailed below.

Hereinafter, the exemplary embodiment of the invention will be explained in detail by referring to the drawings, but is not limited to them.

Figure 2:
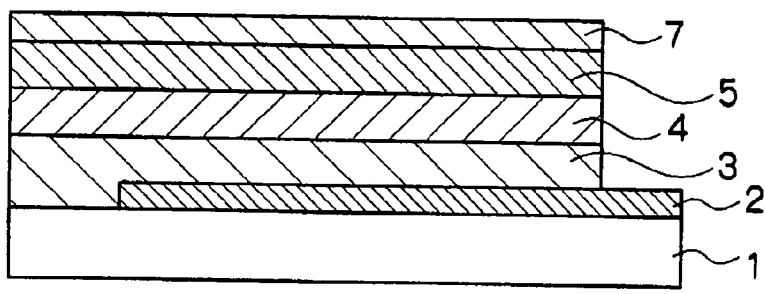
FIG. 2 is a schematic structure showing another example of a layer configuration of an organic electroluminescent device in an exemplary embodiment of the present invention.
Figure 3:
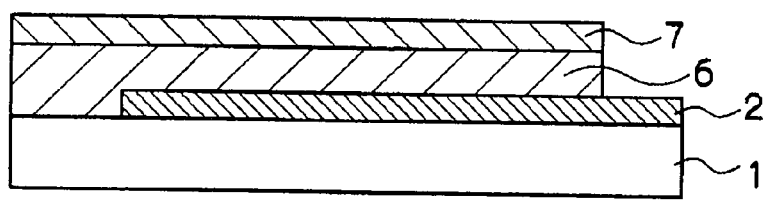
FIG. 3 is a schematic structure showing still another example of a layer configuration of an organic electroluminescent device in an exemplary embodiment of the present invention.
Figure 4:
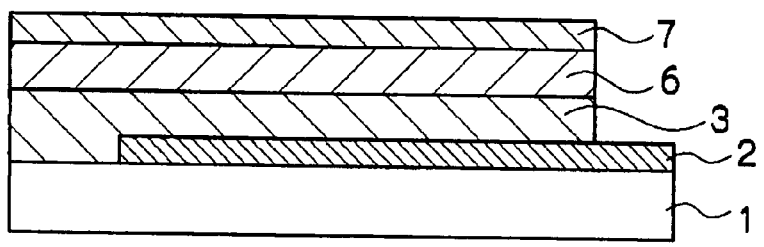
FIG. 4 is a schematic structure showing another example of a layer configuration of an organic electroluminescent device in an exemplary embodiment of the present invention.

FIGS. 1 to 4 are schematic cross-sectional views for explaining a layer construction of the organic electroluminescent device of the invention. FIGS. 1-2 and 3 show one example of the case where the organic compound layer comprises a plurality of layers, and FIG. 4 shows an example of the case where the organic compound layer comprises one layer. In FIGS. 1 to 4, the same symbol is given to a member having the same function.

An organic electroluminescent device shown in FIG. 1 includes a transparent electrode 2, a luminescent layer 4, at least one layer 5 of an electron transport layer and an electron injection layer and a rear electrode 7 sequentially layered on a transparent insulating substrate 1 and corresponds to the layer configuration (1). However, when a layer expressed by a reference numeral 5 is made of an electron transport layer and an electron injection layer, on a side of the rear electrode 7 of the luminescent layer 4, an electron transport layer, an electron injection layer and a rear electrode 7 are layered in this order.

An organic electroluminescent device shown in FIG. 2 includes a transparent electrode 2, at least one layer 3 of a hole transport layer and a hole injection layer, a luminescent layer 4, at least one layer 5 of an electron transport layer and an electron injection layer and a rear electrode 7 sequentially layered on a transparent insulating substrate 1 and corresponds to the layer configuration (2). However, when a layer expressed by a reference numeral 3 is made of a hole transport layer and a hole injection layer, on a side of the rear electrode 7 of the transparent electrode 2, a hole injection layer, a hole transport layer and a luminescent layer 4 are layered in this order. Furthermore, when a layer shown by reference numeral 5 is made of an electron transport layer and an electron injection layer, on a side of the rear electrode 7 of the luminescent layer 4, an electron transport layer, an electron injection layer and a rear electrode 7 are layered in this order.

An organic electroluminescent device shown in FIG. 3 includes a transparent electrode 2, at least one layer 3 of a hole transport layer and a hole injection layer, a luminescent layer 4 and a rear electrode 7 sequentially layered on a transparent insulating substrate 1 and corresponds to the layer configuration (3). However, when a layer expressed by a reference numeral 3 is made of a hole transport layer and a hole injection layer, on a side of the rear electrode 7 of the transparent electrode 2, a hole injection layer, a hole transport layer and a luminescent layer 4 are layered in this order.

An organic electroluminescent device shown in FIG. 4 includes a transparent electrode 2, a luminescent layer 6 having the charge transportability and a rear electrode 7 sequentially layered in this order on a transparent insulating substrate 1.

Furthermore, a top emission structure, a structure where a transparent electrode is used in both of a negative electrode and a positive electrode to form a transmissive type and a structure where a plurality of stairs of the layer configurations shown in FIGS. 1 through 4 is stacked are possible as well.

Hereinafter, the drawings will be explained in detail.

In the case of a layer configuration of the organic electroluminescent device shown in FIGS. 1 to 4, a transparent insulating substrate 1 is preferably transparent for taking out the emitted light and glass, plastic film and the like are used. The transparency means that transmittance of the light in a visible region is 10% or more, and further, it is preferable that this transmittance is 75% or more.

A transparent electrode 2 is transparent for taking out the emitted light as in the transparent insulating substrate, and it is preferable that the electrode has the large work function for carrying out the injection of holes. It is preferable that the value of this work function is 4 eV or more. Examples of the transparent electrode 2 include oxidized films such as tin indium oxide (ITO), tin oxide (NESA), indium oxide, zinc oxide, indium zinc oxide and the like, and gold, platinum, palladium and the like formed by deposition or sputtering. A lower sheet resistance of a transparent electrode 2 is desirable, a few hundreds Ω/sq or less is preferable, further 100 Ω/sq or less is more preferable. In addition, in a transparent electrode 2, transmittance of the light in a visible region is 10% or more as in the transparent insulating substrate, and further, it is preferable that this transmittance is 75% or more.

Furthermore, in order to improve durability or luminescent efficiency of an organic electroluminescent device, to a charge transporting polyester used in the invention, in order to control the hole mobility, a hole transport material other than the charge transporting polyester may be blended and dispersed in a range of from 0.1 to 50 mass % to form. As such hole transport materials, a tetraphenylenediamine derivative, triphenylamine derivative, carbazole derivative, stilbene derivative, arylhydrazone derivative and porphyrin compound can be included. From the viewpoint of excellent compatibility with the charge transporting polyester, a tetraphenylenediamine derivative and triphenylamine derivative are preferred.

Still furthermore, same as above, when the electron mobility is controlled, to the charge transporting polyester, an electron transport material may be blended and dispersed in a range of from 0.1 to 50 mass % to form. As such electron transport materials, an oxadiazole derivative, nitro-substituted fluorenone derivative, diphenoquinone derivative, thiopyrane dioxide derivative, silole derivative, chelate type organometallic complex, polynucleus or condensed aromatic ring compound, perylene derivative, triazole derivative and fluorenylidene derivative can be included.

Furthermore, when both of the hole mobility and electron mobility are necessary to be controlled, to the charge transporting polyester, both of a hole transport material and an electron transport material may be blended together.

In order to improve the film forming property and to inhibit pinholes from occurring and so on, an appropriate resin (polymer) and an additive may be added. As specific resins, electroconductive resins such as a polycarbonate resin, polyester resin, methacrylic resin, acrylic resin, polyvinyl chloride resin, cellulose resin, urethane resin, epoxy resin, polystyrene resin, polyvinyl acetate resin, styrene/butadiene copolymer, vinylidene chloride/acrylonitrile copolymer, vinyl chloride/vinyl acetate/maleic anhydride copolymer, silicone resin, poly-N-vinyl carbazole resin, polysilane resin, polythiophene and polypyrrole can be used. Furthermore, as the additives, known anti-oxidants, UV-absorbents and plasticizers can be used.

Furthermore, in order to improve the charge injectability, there is a case where a hole injection layer and/or an electron injection layer is used. As the hole injection materials, a phenylenediamine derivative, phthalocyanine derivative, indanthrene derivative and polyalkylenedioxythiophene derivative can be used. Still furthermore, Lewis acid or sulfonic acid may be blended therewith. As the electron injection materials, metals such as Li, Ca and Sr, metal fluorides such as LiF and $MgF_2$ and metal oxides such as MgO, $Al_2O_3$ and LiO can be used.

Furthermore, when the charge transporting polyester is used in another function than the luminescence function, a luminescent compound is used as a luminescent material. As the luminescent material, a compound that shows high luminescence quantum efficiency in a solid state is used. The luminescent material may be any one of a low molecular weight compound and a high molecular weight compound. Preferable examples as organic low molecular weight compounds include a chelate type organometallic complex, polynucleus or condensed aromatic ring compound, perylene derivative, cumarin derivative, styrylarylene derivative, silole derivative, oxazole derivative, oxathiazole derivative and oxadiazole derivative. Preferable examples as organic high molecular weight compounds include a polyparaphenylene derivative, polyparaphenylenevinylene derivative, polythiophene derivative and polyacetylene derivative. Preferable specific examples include luminescent materials from (IV-1) to (IV-17) below without restricting thereto. In the luminescent materials from (IV-13) to (IV-17), V represents the above-shown functional group and n and j represent an integer from 1 or 2 or more.

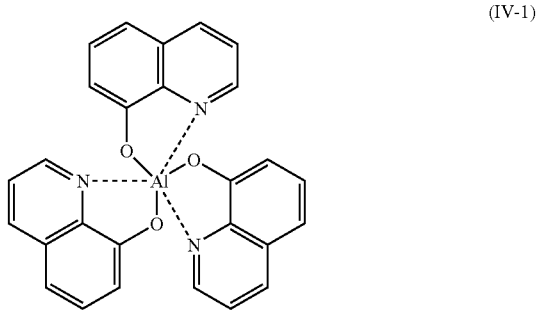

(IV-1)

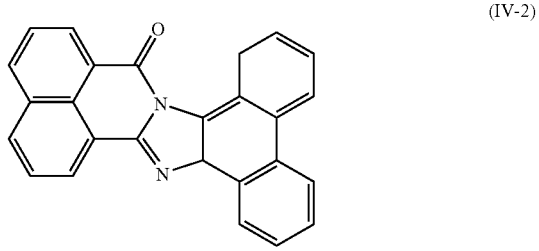

(IV-2)

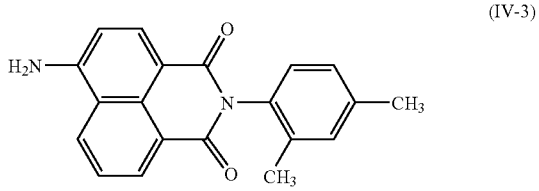

(IV-3)

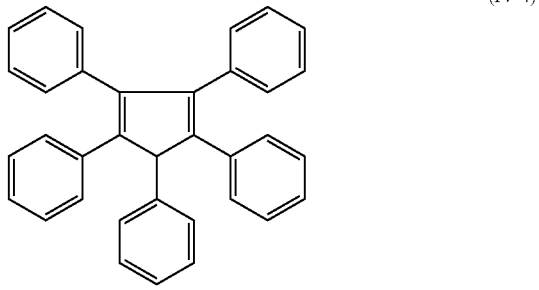

(IV-4)

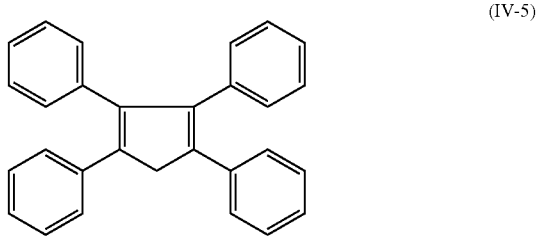

(IV-5)

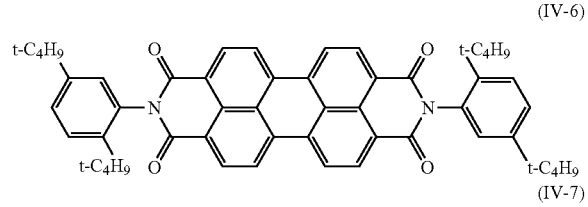

(IV-6)

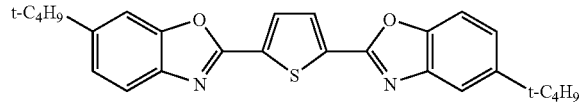

(IV-7)

-continued

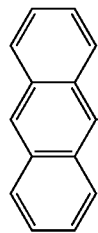
(IV-8)

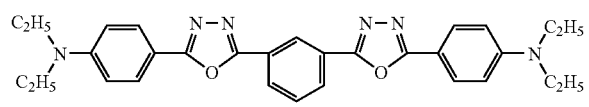
(IV-9)

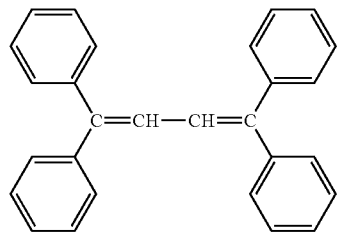
(IV-10)

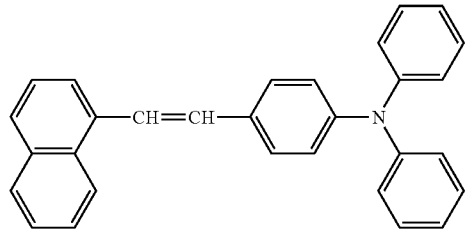
(IV-11)

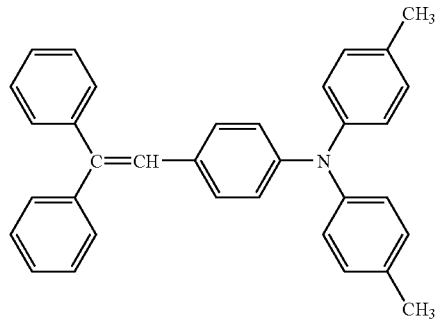
(IV-12)

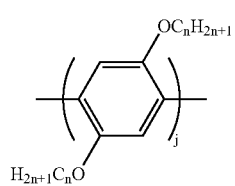
(IV-13)

-continued

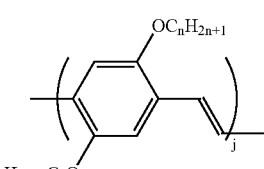
(IV-14)

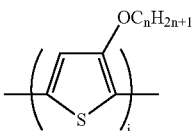
(IV-15)

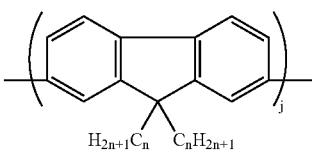
(IV-16)

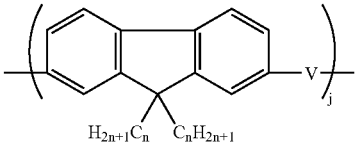
(IV-17)

Furthermore, in order to improve the durability of the device or to improve the luminescence efficiency thereof, in the luminescent material or the charge transporting polyester, as a guest material, a dye compound that is different from the luminescent material may be doped. A doping ratio of the dye compound is in a range of substantially from 0.001 to 40 mass % and preferably in the range of substantially from 0.001 to 10 mass %. As the dye compounds that are doped like this, organic compounds that are excellent in the compatibility with the luminescent material and the charge transporting polyester and do not disturb excellent thin film formation of the luminescent layer are used. Exemplary examples thereof include a cumarin derivative, DCM derivative, quinacridone derivative, rubrene derivative, porphyrin derivative and metal complex compounds of Ir, Eu and Pt. Preferable specific examples thereof include dye compounds from the following (V-1) to (V-6) without restricting thereto.

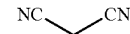

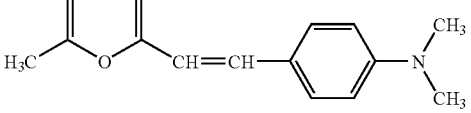
(V-1)

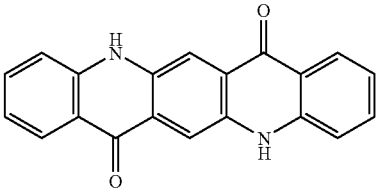
(V-2)

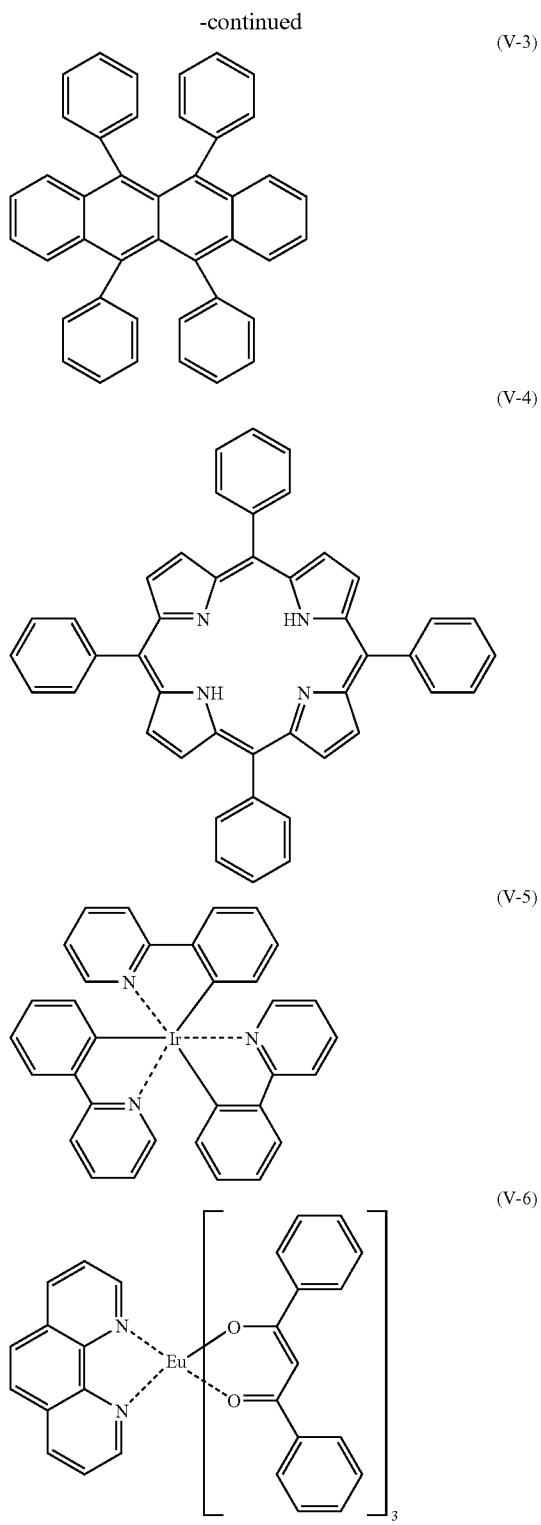

oxide, magnesium oxide, aluminum oxide, indium/tin oxide, tin oxide, iridium oxide, zinc oxide and indium/zinc oxide can be included. Furthermore, as the metal fluorides, lithium fluoride, magnesium fluoride, strontium fluoride, calcium fluoride and aluminum fluoride can be included. Furthermore, on the rear electrode 7, in order to inhibit an organic electroluminescent device from deteriorating due to moisture or oxygen, a protective layer may be disposed.

Specific materials for the protective film include metals such as In, Sn, Pb, Au, Cu, Ag and Al, metal oxides such as MgO, $SiO_2$ and $TiO_2$ and resins such as a polyethylene resin, polyurea resin and polyimide resin. When a protective layer is formed, a vacuum vapor deposition method, sputtering method, plasma polymerization method, CVD method and coating method can be applied.

The organic electroluminescent devices shown in FIGS. 1 through 4 can be prepared when, firstly, on a transparent electrode 2, the individual layers corresponding to the layer configurations of the respective organic electroluminescent devices are sequentially formed. At least one layer 3 of the hole transport layer and hole injection layer, the luminescent layer 4, at least one layer 5 of the electron transport layer and electron injection layer, or the luminescent layer 6 with the charge transportability can be formed by vacuum depositing the respective materials or by dissolving or dispersing the respective materials in an appropriate organic solvent followed by coating an obtained coating liquid on the transparent electrode by means of a spin coating method, casting method, dipping method or inkjet method. Among these, from the viewpoints of being capable of coating a necessary amount of a layer forming material at a position of a desired pixel, slight in a waste material, tender to earth accordingly, capable of patterning with high definition, easy to obtain a large area panel and large in the degree of freedom of printing targets, the inkjet method can be preferably used. Specifically, as a producing method of an organic electroluminescent device, it is particularly preferable to have a coating process where a coating liquid in which a constituent component of an organic compound layer is dissolved in a solvent is coated by use of the inkjet method.

In the case of using the inkjet method, an organic compound layer having a desired film thickness and shape can be formed when, with an organic compound layer coating liquid in place of ink, drops of the organic compound layer coating liquid is discharged from a nozzle of a liquid drop discharge head, on a desired position on a substrate.

Furthermore, a fundamental configuration and principle can be applied, and as the liquid drop discharge head one similar to a recording head in an inkjet printer can be used. That is, a method where, when external stimulus such as pressure or heat is applied on the organic compound layer coating liquid, drops of the organic compound layer coating liquid is discharged from a nozzle (so-called piezo inkjet method using a piezoelectric device, thermal inkjet method using a thermal boiling phenomenon and the like) can be used.

However, when an organic electroluminescent device of an exemplary embodiment is produced, the external stimulus is preferred to be pressure to heat. When the external stimulus is heat, in an inkjet printing process from discharge of the organic compound layer coating liquid from a nozzle to formation (solidification) of a film due to volatilization of a solvent in the organic compound layer coating liquid landed on a substrate, the viscosity of the organic compound layer coating liquid largely varies due to heat, resulting in, in some cases, being difficult to control the leveling property and the patterning accuracy. In addition thereto, charge transporting When an organic electroluminescent device is constituted in a layer configuration shown in FIGS. 1 through 4, in the rear electrode 7, a metal, metal oxide or metal fluoride that can be vacuum deposited and has a small work function for carrying out electron injection is used. As the metals, magnesium, aluminum, gold, silver, iridium, lithium, calcium and alloys thereof can be included. As the metal oxides, lithium polyether that is poor in the heat resistance becomes incapable of using, resulting in narrowing choice of materials.

Furthermore, as a system that is used to produce an organic electroluminescent device of an exemplary embodiment, which uses an inkjet method, other than the liquid drop discharge head, as needs arise, for instance, a fastening or conveying unit of a substrate on which an organic electroluminescent device is formed or a scanning unit of a liquid drop discharge head, which scans the liquid drop head in a plane direction of the substrate may be provided.

The organic compound layer coating liquid is not particularly restricted in the composition or physicality. However, the viscosity at 25° C. of the organic compound layer coating liquid is preferably in a range of from 0.01 to 1000 cps and more preferably in a range of from 1 to 100 cps.

When the viscosity is less than 0.01 cps, in some cases, the organic compound layer coating liquid landed on the substrate tends to expand in a substrate plane direction to be difficult to control a film thickness or to be poor in the patterning accuracy. On the other hand, when the viscosity exceeds 1000 cps, the viscosity of the organic compound layer coating liquid becomes too high to be, in some cases, likely to cause discharge fault.

The viscosity of the organic compound layer coating liquid, when contents of the charge transporting polyester and other additive components added as needs arise or the molecular weight of the charge transporting polyester are controlled, can be adjusted to a desired value.

A film thickness of each of at least one layer 3 of the hole transport layer and hole injection layer, the luminescent layer 4, at least one layer 5 of the electron transport layer and electron injection layer, and the luminescent layer 6 with the charge transportability is 10 µm or less and particularly preferably in a range of from 0.001 to 5 µm. A dispersion state of the respective materials (the non-conjugate polymer and luminescent material) may be a molecular dispersion state or a fine particle dispersion state such as micro-crystallite. In a case of a layering method that uses a coating liquid, in order to obtain the molecular dispersion state, a dispersion solvent has to be selected in consideration of the dispersibility and the solubility of the respective materials. In order to disperse in a fine particle state, a ball mill, sand mill, paint shaker, attritor, homogenizer and ultrasonic method can be used.

Furthermore, in the case of the organic electroluminescent devices shown in FIGS. 1 and 2, organic electroluminescent devices of the invention can be obtained when, on at least one layer 5 of the electron transport layer and the electron injection layer, the rear electrode 7 is formed by means of the vacuum deposition method or sputtering method. Still furthermore, in the case of the organic electroluminescent device shown in FIG. 3, when the rear electrode 7 is formed on the luminescent layer 4 by means of the vacuum deposition method or the sputtering method, and in the case of the organic electroluminescent device shown in FIG. 4, when the rear electrode 7 is formed on the luminescent layer 6 having the charge transportability by means of the vacuum deposition method or the sputtering method, organic electroluminescent devices of the invention can be obtained.

The organic electroluminescent device of an exemplary embodiment can be luminesced when, between a pair of electrodes, a direct current voltage in the range of, for instance, 4 to 20 V and a current density in a range of from 1 to 200 $mA/cm^2$ is applied.

<Image Display Medium>

An image display medium of an exemplary embodiment is configured by disposing organic electroluminescent devices in at least one of matrix form or segment form. In an exemplary embodiment, when the organic electroluminescent devices are disposed in matrix form, only an electrode may be disposed in matrix form, or both the electrode and organic compound layer may be disposed in matrix form. When the organic electroluminescent device is disposed in segment form, only an electrode may be disposed in segment form, or both the electrode and the organic compound layer may be disposed in segment form.

The organic compound layer formed in matrix form or in segment form can be readily formed by use of the inkjet method.

As a driving system and a driving method of the organic electroluminescent device formed in matrix form or the organic electroluminescent device formed in segment form, so far known ones can be used.

EXAMPLES

Hereinafter, the exemplary embodiment will be explained more specifically with reference to the examples, however, the scope of the invention is not limited thereby.

Example 1

Synthesis Example 1

In DMSO (250 ml), 2,7-diiodefluorene (0.12 mol), iodomethane (0.62 mol) and benzyltriethyl ammonium chloride (0.0044 mol) as a phase transfer catalyst are dissolved. Therein, an aqueous solution of 50% sodium hydroxide (100 ml) is dropped over substantially 1 hr, followed by agitating at 40° C. for 3 hr to complete a reaction. After cooling to room temperature, toluene substitution and washing with water are carried out to neutralize, followed by drying in a vacuum at 50° C. to obtain 2,7-diiode-9,9-dimethylfluorene (yield: 70%).

Under a nitrogen atmosphere, a n-butyl lithium/THF solution is cooled to −78° C., and, thereto, a solution of 9,9-dimethyl-2,7-diiodefluorene/THF is dropped over 1 hr. After completion of dropping, a temperature is raised to 0° C., followed by agitating for 3 hr. Thereafter, a solution of tri-n-butyl borate/THF is added, followed by agitating at −78° C. for 3 hr. After 3 hr, sufficiently cooled 1N HCl is added to isolate an organic phase. To the organic phase, a solution of 1M NaOH is added, followed by further adding hydrochloric acid to an aqueous phase to precipitate crystal. The crystal, after filtered by suction, is vacuum dried at 80° C. to obtain 9,9-dimethylfluorene-2,7-diboronic acid.

Under a nitrogen atmosphere, tetrakis(triphenylphosphine)palladium(0) (0.6 mmol) is dissolved in THF (30 ml), followed by adding thereto 3-(4-iodephenyl)propionate methyl ester (24 mmol), a solution of 2M $Na_2CO_3$ (48 ml) and 9,9-dimethylfluorene-2,7-diboronic acid (12 mmol)/THF (30 ml) in this order. Thereafter, after refluxing for 6 hr, a reaction is brought to completion. The solution is cooled to room temperature, followed by substituting with toluene and adding substantially 30 ml of 1N HCl, further followed by washing a toluene phase with water until neutrality is obtained. After drying with sodium sulfate, followed by filtering and distilling the solvent away, and thereby a crude product is obtained. After washing with substantially 100 ml of methanol, a colorless crystal is obtained. Furthermore, by passing through a short column from hexane/ethyl acetate to remove original components, followed by recrystallizing, and thereby a monomer compound (16) is obtained.

Into a 50 ml three-mouthed eggplant-shaped flask, 1.3 g of the monomer compound (16) is charged, thereto, under a nitrogen atmosphere, ethylene glycol (10 ml) and tetrabutyl orthotitanate monomer (10 mg) are added, followed by sufficiently deaerating, further followed by allowing reacting at 200° C. for 5 hr, still furthermore followed by allowing reacting under reduced pressure of 4.8 Pa at a temperature of 230° C. for 5 hr, followed by cooling to room temperature, further followed by dissolving in 50 ml of monochlorobenzene under heating, still further followed by filtering the insoluble with a 0.5 μm PTFE filter under pressure, followed by dropping a filtrate into 1000 ml of methanol that is agitated, and thereby the polymer is reprecipitated. The obtained polymer is filtered by suction, followed by sufficiently washing with 500 ml of methanol, further followed by drying, and thereby 0.9 g of the polymer [exemplified compound 11] is obtained.

A molecular weight of the exemplified compound is measured by GPC gel permeation chromatography (GPC) and found for Mw to be $1.3 \times 10^5$ (based on styrene) and for Mn/Mw to be 1.3.

—Preparation of Device—

A slit photomask is used to pattern, by photolithography, an ITO formed on a transparent substrate (produced by Sanyo Vacuum Industries Co., Ltd.), followed by etching to form a slit ITO electrode (2 mm wide). In the next place, the ITO glass substrate is washed with a neutral detergent, pure water, acetone (for electronics use, produced by Kanto Kagaku) and isopropanol (for electronics use, produced by Kanto Kagaku), respectively, for 5 min under application of ultrasonic, followed by drying by use of a spin coater. A monochlorobenzene solution of 5% by weight of a charge transporting polyester [exemplified compound (11)] is prepared and filtered with a 0.1 μm PTFE filter, followed by coating on the substrate by a dipping method, and thereby a thin film having a thickness of 0.050 μm is formed as a hole transport layer. As a luminescent material, the exemplified compound (IV-1) is deposited and thereby a luminescent layer having a thickness of 0.055 μm is formed. Subsequently, with a metallic mask with slit holes disposed, a Mg—Ag alloy is codeposited to form a rear electrode having a width of 2 mm and a thickness of 0.15 μm so as to intersect with an ITO electrode. An effective area of a formed organic electroluminescent device is 0.04 cm².

Example 2

Synthesis Example 2

According to a method similar to that of the synthesis example 1, 9,9-diisopropylfluorene-2,7-diboronic acid is obtained. Under a nitrogen atmosphere, tetrakis(triphenylphosphine)palladium(0) (0.6 mmol) is dissolved in THF (30 ml), followed by adding thereto 3-(4-iodephenyl)propionate methyl ester (24 mmol), a solution of 2M Na$_2$CO$_3$ (48 ml) and 9,9-diisopropylfluorene-2,7-diboronic acid (12 mmol)/THF (30 ml) in this order. Thereafter, after refluxing for 6 hr, a reaction is brought to completion. The solution is cooled to room temperature, followed by substituting with toluene and adding substantially 30 ml of 1N HCl, further followed by washing a toluene phase with water until neutrality is obtained. After drying with sodium sulfate, followed by filtering and distilling the solvent away, and thereby a crude product is obtained. After washing with substantially 100 ml of methanol, a colorless crystal is obtained. Furthermore, by passing through a short column from hexane/ethyl acetate to remove original components, finally followed by recrystallizing, and thereby a monomer compound (8) is obtained.

Into a 50 ml three-mouthed eggplant-shaped flask, 1.3 g of the monomer compound (8) is charged, thereto, under a nitrogen atmosphere, ethylene glycol (10 ml) and tetrabutyl orthotitanate monomer (10 mg) are added, followed by sufficiently deaerating, further followed by allowing reacting at 200° C. for 5 hr, still further followed by allowing reacting under reduced pressure of 4.8 Pa at a temperature of 230° C. for 5 hr, followed by cooling to room temperature, further followed by dissolving in 50 ml of monochlorobenzene under heating, still further followed by filtering the insoluble with a 0.5 μm PTFE filter under pressure, followed by dropping a filtrate into 1000 ml of methanol that is agitated, and thereby the polymer is reprecipitated. The obtained polymer is filtered by suction, followed by sufficiently washing with 500 ml of methanol, further followed by drying, and thereby 0.8 g of the polymer [exemplified compound 6] is obtained.

A molecular weight of the exemplified compound is measured by GPC gel permeation chromatography (GPC) and found for Mw to be $1.0 \times 10^5$ (based on styrene) and for Mn/Mw to be 1.4.

—Preparation of Device—

An ITO glass substrate is etched and washed similarly to example 1. A dichloroethane solution of 1 parts by weight of the charge transporting polyester [exemplified compound (6)], 4 parts by weight of poly(N-vinylcarbazole) and 10% by weight of the exemplified compound (IV-1) is prepared and filtered with a 0.1 μm PTFE filter. The dichloroethane solution is coated by a spin coating method on a glass substrate on which a strip of ITO electrode having a width of 2 mm is formed to form a luminescent layer having the charge transportability at a film thickness of substantially 0.15 μm. After sufficiently drying, a Mg-Ag alloy is codeposited to form a rear electrode having a width of 2 mm and a thickness of 0.15 μm so as to intersect with an ITO electrode. An effective area of a formed organic electroluminescent device is 0.04 cm².

Example 3

Synthesis Example 3

In 100 ml of ether, 2,7-dibromofluorenone (0.1 mol) and 4-tert-butyl phenyl magnesium bromide (0.2 mol) are refluxed for 3 hr, followed by cooling to room temperature, further followed by washing with 100 ml of 1N HCl, still further followed by washing with water until the neutrality is obtained. After drying, 2,7-dibromo[9,9-(4'-di-tert-butylphenyl)]fluorene (0.06 mol) is obtained (reference literature: Adv. Mater., 13, 1690 (2001)).

In the next place, according to a method similar to that of synthesis example 1, 2,7-[9,9-(4',4'-di-tert-butylphenyl)] fluorene diboronic acid (0.03 mol) is obtained.

Under a nitrogen atmosphere, tetrakis(triphenylphosphine)palladium(0) (0.6 mmol) is dissolved in THF (50 ml), followed by adding thereto 3-(4'-iodephenyl-4-yl)propionate methyl ester (24 mmol), a solution of 2M Na$_2$CO$_3$ (48 m mol) and 2,7-[9,9-(4,4'-di-tert-butylphenyl)]fluorene diboronic acid (12 mmol)/THF (50 ml) in this order. Thereafter, after refluxing for 7 hr, a reaction is brought to completion. The solution is cooled to room temperature, followed by substituting with toluene and adding substantially 30 ml of 1N HCl, further followed by washing a toluene phase with water until neutrality is obtained. After drying with sodium sulfate, followed by filtering and distilling the solvent away, and thereby a crude product is obtained. After washing with substantially 100 ml of methanol, a colorless crystal is obtained. Furthermore, by passing through a short column from hexane/ethyl acetate to remove original components, followed by finally recrystallizing, and thereby a monomer compound (43) is obtained.

Into a 50 ml three-mouthed eggplant-shaped flask, 1.3 g of the monomer compound (43) is charged, thereto, under a nitrogen atmosphere, ethylene glycol (10 ml) and tetrabutyl orthotitanate monomer (10 mg) are added, followed by sufficiently deaerating, further followed by allowing reacting at 200° C. for 5 hr, still further followed by allowing reacting under reduced pressure of 4.8 Pa at a temperature of 230° C. for 5 hr, followed by cooling to room temperature, further followed by dissolving in 50 ml of monochlorobenzene under heating, still further followed by filtering the insoluble with a 0.5 μm PTFE filter under pressure, followed by dropping a filtrate into 1000 ml of methanol that is agitated, and thereby the polymer is reprecipitated. The obtained polymer is filtered by suction, followed by sufficiently washing with 500 ml of methanol, further followed by drying, and thereby 0.9 g of the polymer [exemplified compound 16] is obtained.

A molecular weight of the exemplified compound is measured by GPC gel permeation chromatography (GPC) and found for Mw to be $8.8 \times 10^4$ (based on styrene) and for Mn/Mw to be 1.7.

—Preparation of Device—

On an ITO glass substrate etched and washed similarly to example 1, similarly to example 1, as a hole transport layer, a charge transporting polyester [exemplified compound (16)] is formed with a thickness of 0.050 μm. As a luminescent layer, the exemplified compound (IV-1) and the exemplified compound (V-1) are formed with a thickness of 0.065 μm and as an electron transport layer the exemplified compound (IV-9) is formed with a thickness of 0.030 μm. Subsequently, a Mg—Ag alloy is codeposited to form a rear electrode having a width of 2 mm and a thickness of 0.15 μm so as to intersect with an ITO electrode. An effective area of a formed organic electroluminescent device is 0.04 cm$^2$.

Example 4

Synthesis Example 4

According to a method similar to that of synthesis example 3, 2,7-dibromofluorenone (0.1 mol) and 2-biphenyl magnesium bromide are agitated in ether for 3 hr, followed by cooling to room temperature, further followed by slowly adding 50 ml of acetic acid. Ether is distilled away under reduced pressure, followed by adding thereto substantially 5 ml of HCl. Thereafter, the solution is refluxed for 1 hr, followed by filtering precipitate by suction, further followed by washing with water and recrystallizing with methanol. Thereby, 2,7-dibromo-9,9'-spirobifluorene is obtained (yield: 60%).

Subsequently, a mixed solution of 2,7-dibromo-9,9'-spirobifluorene (0.3 mol), methyl acrylate (0.33 mol), trimethyl amine (0.6 mol), palladium acetate (0.003 mol) and tri(o-tolyl)phosphine (0.006 mol) is heated at 100° C. under a nitrogen atmosphere. After a reaction comes to completion, the solution is poured into toluene, followed by washing with pure water, further followed by adding magnesium sulfate to dry. After distilling away the solvent, into a mixed solution of toluene and methanol, palladium carbon (10%) is added, followed by agitating under a hydrogen atmosphere to apply contact hydrogen reduction. Thereafter, the solution is filtered with a sellite, further followed by distilling away the solvent, still further followed by refining an obtained crude product by column chromatography and recrystallization, and thereby a monomer compound [14] (0.15 mol) is obtained.

Into a 50 ml three-mouthed eggplant-shaped flask, 1.3 g of the monomer compound [14] is charged, thereto, under a nitrogen atmosphere, ethylene glycol (10 ml) and tetrabutyl orthotitanate monomer (10 mg) are added, followed by sufficiently deaerating, further followed by allowing reacting at 200° C. for 5 hr, still further followed by allowing reacting under reduced pressure of 4.8 Pa at a temperature of 230° C. for 5 hr, followed by cooling to room temperature, further followed by dissolving in 50 ml of monochlorobenzene under heating, still further followed by filtering the insoluble with a 0.5 μm PTFE filter under pressure, followed by dropping a filtrate into 1000 ml of methanol that is agitated, and thereby the polymer is reprecipitated. The obtained polymer is filtered by suction, followed by sufficiently washing with 500 ml of methanol, further followed by drying, and thereby 0.9 g of the polymer [exemplified compound 10] is obtained.

A molecular weight of the exemplified compound is measured by GPC gel permeation chromatography (GPC) and found for Mw to be $7.4 \times 10^4$ (based on styrene) and for Mn/Mw to be 1.8.

—Preparation of Device—

On an ITO glass substrate etched and washed similarly to example 1, similarly to example 1, as a hole transport layer, a charge transporting polyester [exemplified compound (10)] is formed with a thickness of 0.050 μm by use of an inkjet method. As a luminescent layer, the exemplified compound (IV-17) and the exemplified compound (V-5) are formed with a thickness of 0.065 μm by use of a spin coating method. After sufficiently drying, Ca and Al, respectively, are deposited with thicknesses of 0.08 μm and 0.15 μm to form a rear electrode having a width of 2 mm and a total thickness of 0.23 μm so as to intersect with an ITO electrode. An effective area of a formed organic electroluminescent device is 0.04 cm$^2$.

Example 5

Synthesis Example 5

With 9,9-dimethylfluorene-2,7-diboronic acid and 2,7-di-iodo-9,9-dimethyl fluorene, which are synthesized according to synthesis example 1, a Suzuki reaction is carried out. Under a nitrogen atmosphere, tetrakis(triphenylphosphine)palladium(0) (1.0 mmol) is dissolved in THF (50 ml), followed by adding thereto 2,7-diiodo-9,9-dimethyl fluorene (50 mmol), a solution of 2M Na$_2$CO$_3$ (50 ml) and 9,9-dimethylfluorene-2,7-diboronic acid (25 mmol)/THF (100 ml) in this order. Thereafter, after refluxing for 7 hr, a reaction is brought to an end. The solution is cooled to room temperature, followed by substituting with toluene and adding substantially 30 ml of 1N HCl, further followed by washing a toluene phase with water until neutrality is obtained. After drying with sodium sulfate, followed by filtering and distilling the solvent away, and thereby a crude product is obtained. After washing with substantially 100 ml of methanol, a colorless crystal is obtained. Furthermore, by passing through a short column from hexane/ethyl acetate to remove original components, finally followed by recrystallizing, and thereby fluorene trimer (20 mmol) is obtained.

Subsequently, the fluorene trimer is dissolved in bromine (50 mmol) and acetic acid (800 ml) to react at room temperature for 5 hr. A deposited precipitate is filtered by suction, followed by washing water, further followed by washing with methanol of 500 ml. After drying, a fluorene trimer dibromide (18 mmol) is obtained.

From this compound a boronic acid is obtained according to a method similar to that of example 1 (10 mmol).

Under a nitrogen atmosphere, tetrakis(triphenylphosphine)palladium(0) (0.5 mmol) is dissolved in THF (50 ml), followed by adding thereto 3-(4-iodophenyl)propionate methyl ester (20 mmol), a solution of 2M $Na_2CO_3$ (20 ml) and fluorene trimer diboronic acid (10 mmol)/THF (50 ml) in this order. Thereafter, after refluxing for 8 hr, a reaction is brought to an end. The solution is cooled to room temperature, followed by substituting with toluene and adding substantially 30 ml of 1N HCl, further followed by washing a toluene phase with water until neutrality is obtained. After drying with sodium sulfate, followed by filtering and distilling the solvent away, and thereby a crude product is obtained. After washing with substantially 100 ml of methanol, a colorless crystal is obtained. Furthermore, by passing through a short column from hexane/ethyl acetate to remove original components, finally followed by recrystallizing, and thereby a monomer compound (116) (6 m mol) is obtained.

Into a 50 ml three-mouthed eggplant-shaped flask, 1.0 g of the monomer compound (116) is charged, thereto, under a nitrogen atmosphere, ethylene glycol (10 ml) and tetrabutyl orthotitanate monomer (10 mg) are added, followed by sufficiently deaerating, further followed by allowing reacting at 200° C. for 5 hr, still further followed by allowing reacting under reduced pressure of 4.8 Pa at a temperature of 230° C. for 5 hr, followed by cooling to room temperature, further followed by dissolving in 50 ml of monochlorobenzene under heating, still further followed by filtering the insoluble with a 0.5 μm PTFE filter under pressure, followed by dropping a filtrate into 1000 ml of methanol that is agitated, and thereby the polymer is reprecipitated. The obtained polymer is filtered by suction, followed by sufficiently washing with 500 ml of methanol, further followed by drying, and thereby 0.7 g of the polymer [exemplified compound 28] is obtained.

A molecular weight of the exemplified compound is measured by GPC gel permeation chromatography (GPC) and found for Mw to be $6.5 \times 10^4$ (based on styrene) and for Mn/Mw to be 1.6.

—Preparation of Device—

An ITO glass substrate is etched and washed similarly to example 1. A dichloroethane solution of 1.5% by weight of the charge transporting polyester [exemplified compound (28)] used in example 1 is prepared and filtered with a 0.1 μm PTFE filter. The dichloroethane solution is coated on a glass substrate on which a strip of ITO electrode having a width of 2 mm is formed by etching to form as a hole transport layer a thin film having a film thickness of substantially 0.05 μm by an inkjet method. As a luminescent material, the exemplified compound (IV-14) is formed into a luminescent layer having a thickness of 0.050 μm by an inkjet method. After sufficiently drying, Ca and Al, respectively, are deposited with thicknesses of 0.08 μm and 0.15 μm to form a rear electrode having a width of 2 mm and a total thickness of 0.23 μm so as to intersect with an ITO electrode. An effective area of a formed organic electroluminescent device is 0.04 $cm^2$.

Comparative Example 1

Except that, in place of the exemplified compound (2) used in the example 1, a compound shown by a chemical structural formula (VI) below is used, similarly to example 1, an device is prepared.

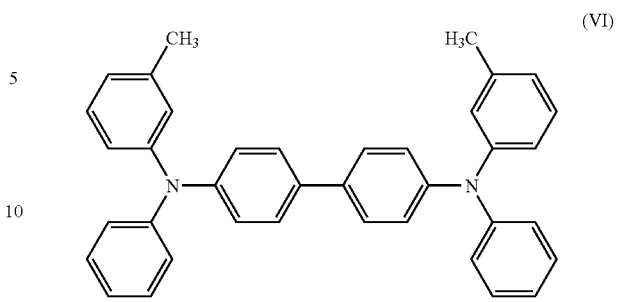

Comparative Example 2

By blending 2 parts by weight of polyvinyl carbazole (PVK) as a charge transporting polymers, 0.1 parts by weight of the exemplified compound (V-1) as a luminescent material and 1 parts by weight of the compound (IV-9) as a charge transporting material, a 10% by weight dichloroethane solution is prepared and filtered with a 0.1 μm PTFE filter. The solution is coated, by means of a dipping method, on a glass substrate on which a slit ITO electrode having a width of 2 mm is etched to form, and thereby a hole transport layer having a film thickness of 0.15 μm is formed. After sufficiently drying, a Mg—Ag alloy is codeposited to form a rear electrode having a width of 2 mm and a thickness of 0.15 μm so as to intersect with an ITO electrode. An effective area of a formed organic EL device is 0.04 $cm^2$.

(Evaluation)

Thus prepared organic EL device is encapsulated by glass with an adhesive in dry nitrogen. With an ITO electrode side as a plus side and a Mg—Al rear electrode side as a minus side, a measurement is carried out.

The luminescence characteristics are compared based on the driving current density when initial brightness is set at 400 $cd/m^2$ under a direct current drive method (DC drive). Furthermore, the luminescence lifetime is evaluated based on a relative time when a drive time when, in room temperature, the brightness of an device of comparative example 1 (initial brightness $L_0$: 400 $cd/m^2$) becomes 0.5 in a ratio of brightness L/initial brightness $L_0$ is set at 1.0 and a voltage increment (=voltage/initial driving voltage) when the brightness of the device becomes 0.5 in a ratio of brightness L/initial brightness $L_0$. Results are shown in Table 24.

Furthermore, of thus prepared organic electroluminescent device, in a vacuum ($1.33 \times 10^{-1}$ Pa), with an ITO side as a plus side and a rear electrode side as a minus side, a direct current voltage of 5 V is applied and the luminescence characteristics are measured to evaluate the maximum brightness and luminescent color at this time. Results are shown in Table 24.

TABLE 24

| | Maximum Brightness ($cd/m^2$) | Luminescent Color | Driving Current Density ($mA/cm^2$) | Voltage Increment ($L/L_0$ = 0.5) | Relative Time ($L/L_0$ = 0.5) |
|---|---|---|---|---|---|
| Example 1 | 17500 | green | 14.8 | 1.10 | 1.47 |
| Example 2 | 16000 | green | 16.9 | 1.09 | 1.33 |
| Example 3 | 21300 | red | 18.5 | 1.07 | 1.70 |
| Example 4 | 19300 | green | 16.2 | 1.16 | 1.56 |
| Example 5 | 12600 | green | 18.5 | 1.22 | 1.68 |

TABLE 24-continued

| | Maximum Brightness (cd/m$^2$) | Luminescent Color | Driving Current Density (mA/cm$^2$) | Voltage Increment (L/L$_0$ = 0.5) | Relative Time (L/L$_0$ = 0.5) |
|---|---|---|---|---|---|
| Comparative Example 1 | 11000 | green | 14.6 | 1.32 | 1.00 |
| Comparative Example 2 | 8750 | green | 15.7 | 1.25 | 1.08 |

In Table 24, it is found that organic electroluminescent devices using the charge transporting polyester has high luminescence intensity, high luminescence efficiency and long lifetime in examples, since the charge transporting polyester has the thermal stability during luminescence and the storage stability, in addition to the charge injectability, charge mobility, thin film formability and luminescence characteristics. Furthermore, since the device has less defects such as pinholes, a large area device can be easily obtained.

All publications, patent applications, and technical standards mentioned in this specification are herein incorporated by reference to the same extent as if such individual publication, patent application, or technical standard was specifically and individually indicated to be incorporated by reference.

It will be obvious to those having skill in the art that many changes may be made in the above-described details of the exemplary embodiments of the present invention. The scope of the invention, therefore, should be determined by the following claims.

What is claimed is:

1. An organic electroluminescent device comprising:
a pair of electrodes including a positive electrode and a negative electrode, at least one of which is transparent or translucent; and
one or a plurality of organic compound layers interposed between the pair of electrodes,
at least one layer of the organic compound layers containing at least one charge transporting polyester having a repeating unit that contains at least one selected from structures represented by the following formula (I-1) as a partial structure:

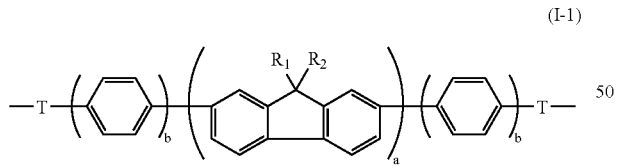

(I-1)

wherein in the formula (I-1), $R_1$ and $R_2$ each independently represent a mono-valent straight chain hydrocarbon group having 1 to 10 carbon atoms, a mono-valent branched chain hydrocarbon group having 3 to 10 carbon atoms, a substituted or unsubstituted mono-valent phenylene group, a substituted or unsubstituted mono-valent polynuclear aromatic hydrocarbon having 2 to 10 aromatic rings, a substituted or unsubstituted mono-valent condensed aromatic hydrocarbon having 2 to 10 aromatic rings, or a substituted or unsubstituted mono-valent aromatic heterocycle; T represents a divalent straight chain hydrocarbon group having 1 to 10 carbon atoms or a divalent branched chain hydrocarbon group having 2 to 10 carbon atoms; a represents an integer from 1 to 4; b represents an integer from 0 to 3.

2. The organic electroluminescent device of claim 1, wherein the organic compound layer includes at least a luminescent layer and at least one layer selected from an electron transport layer or an electron injection layer; and at least one layer selected from the luminescent layer, electron transport layer or electron injection layer includes at least one charge transporting polyesters having a repeating unit containing at least one structure selected from structures represented by the formula (I-1) as a partial structure.

3. The organic electroluminescent device of claim 1, wherein the organic compound layer includes at least a luminescent layer and at least one layer selected from a hole transport layer or a hole injection layer; and at least one layer selected from the luminescent layer, hole transport layer or hole injection layer includes at least one charge transporting polyesters having a repeating unit containing at least one structure selected from structures represented by the formula (I-1) as a partial structure.

4. The organic electroluminescent device of claim 1, wherein the organic compound layer includes at least a luminescent layer, at least one layer selected from a hole transport layer or a hole injection layer, and at least one layer selected from an electron transport layer or an electron injection layer; and at least one layer selected from the luminescent layer, hole transport layer, hole injection layer, electron transport layer or electron injection layer includes at least one charge transporting polyesters having a repeating unit containing at least one structure selected from structures represented by the formula (I-1) as a partial structure.

5. The organic electroluminescent device of claim 1, wherein the organic compound layer includes only a luminescent layer having a charge transport function, and the luminescent layer having a charge transport function includes at least one charge transporting polyester having a repeating unit containing at least one structure selected from structures represented by the formula (I-1) as a partial structure.

6. An organic electroluminescent device comprising:
a pair of electrodes including a positive electrode and a negative electrode, at least one of which is transparent or translucent; and
one or a plurality of organic compound layers interposed between the pair of electrodes,
at least one layer of the organic compound layers containing at least one charge transporting polyester having a repeating unit that contains at least one structure selected from structures represented by the following formula (I-1) as a partial structure, and the charge transporting polyester having a repeating unit that contains at least one structure selected from structures represented by the formula (I-1) as a partial structure is a charge transporting polyester represented by the following formula (II-1) or formula (II-2):

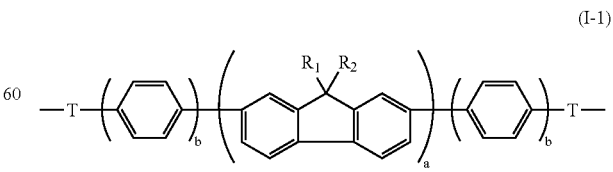

(I-1)

wherein in the formula (I-1), $R_1$ and $R_2$ each independently represent a mono-valent straight chain hydrocarbon group having 1 to 10 carbon atoms, a mono-valent branched chain hydrocarbon group having 3 to 10 carbon atoms, a substituted or unsubstituted mono-valent phenylene group, a substituted or unsubstituted mono-valent polynuclear aromatic hydrocarbon having 2 to 10 aromatic rings, a substituted or unsubstituted mono-valent condensed aromatic hydrocarbon having 2 to 10 aromatic rings or a substituted or unsubstituted mono-valent aromatic heterocycle; T represents a divalent straight chain hydrocarbon group having 1 to 10 carbon atoms or a divalent branched chain hydrocarbon group having 2 to 10 carbon atoms; a represents an integer from 1 to 4; and b represents an integer from 0 to 3;

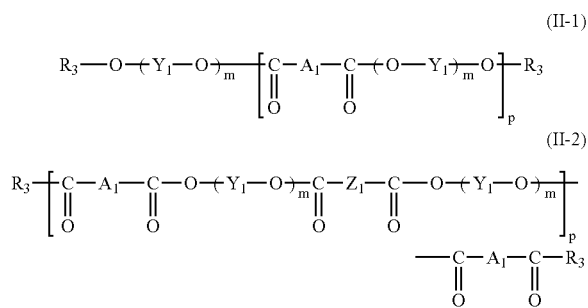

wherein in the formulas (II-1) and (II-2), $A_1$ represents at least structure selected from structures represented by the formula (I-1); $Y_1$ represents a divalent alcohol residue; $Z_1$ represents a divalent carboxylate residue, m represents an integer from 1 to 5, $R_3$ represents a group represented by —O—$(Y_1$—O)m-H or —O—$(Y_1$—O)m-CO—$Z_1$—CO—OR' (in which $Y_1$, $Z_1$ and m have the same meanings as above, and R' represents a hydrogen atom, alkyl group, substituted or unsubstituted aryl group, or substituted or unsubstituted aralkyl group); and p represents an integer from 5 to 5000.

7. The organic electroluminescent device of claim 6, wherein the organic compound layer includes at least a luminescent layer and at least one layer selected from an electron transport layer or an electron injection layer; and at least one layer selected from the luminescent layer, electron transport layer or electron injection layer includes at least one charge transporting polyesters having a repeating unit containing at least one structure selected from structures represented by the formula (I-1) as a partial structure.

8. The organic electroluminescent device of claim 6, wherein the organic compound layer includes at least a luminescent layer and at least one layer selected from a hole transport layer or a hole injection layer; and at least one layer selected from the luminescent layer, hole transport layer or hole injection layer includes at least one charge transporting polyester having a repeating unit containing at least one structure selected from structures represented by the formula (I-1) as a partial structure.

9. The organic electroluminescent device of claim 6, wherein the organic compound layer includes at least a luminescent layer, at least one layer selected from a hole transport layer or a hole injection layer, and at least one layer selected from an electron transport layer or an electron injection layer; and at least one layer selected from the luminescent layer, hole transport layer, hole injection layer, electron transport layer or electron injection layer includes at least one charge transporting polyester having a repeating unit containing at least one structure selected from structures represented by the formula (I-1) as a partial structure.

10. The organic electroluminescent device of claim 6, wherein the organic compound layer includes only a luminescent layer having a charge transport function, and the luminescent layer having a charge transport function includes at least one charge transporting polyester having a repeating unit containing at least one structure selected from structures represented by the formula (I-1) as a partial structure.

11. The organic electroluminescent device of claim 1, wherein a weight average molecular weight of the charge transporting polyester is in a range of from about 5,000 to about 300,000.

12. The organic electroluminescent device of claim 1, wherein the glass transition point (Tg) of the charge transporting polyester is about 60° C. or more.

13. The organic electroluminescent device of claim 1, wherein the charge transporting polyester is doped by a dye compound that is different from a luminescent material and a doping ratio of the dye compound is in a range of from 0.001 to 40 mass %.

14. The organic electroluminescent device of claim 2, wherein film thicknesses of the luminescent layer and the at least one layer selected from an electron transport layer or an electron injection layer are in a range of about from 0.001 to 5 μm.

15. The organic electroluminescent device of claim 3, wherein film thicknesses of the luminescent layer and the at least one layer selected from an hole transport layer or an hole injection layer are in a range of about from 0.001 to 5 μm.

16. A method for producing the organic electroluminescent device of claim 1, comprising at least coating a coating liquid in which a constituent component of the organic compound layer is dissolved in a solvent, by an inkjet method.

17. A method for producing the organic electroluminescent device of claim 6, comprising at least coating a coating liquid in which a constituent component of the organic compound layer is dissolved in a solvent, by an inkjet method.

* * * * *